United States Patent [19]
Ohmi et al.

[11] Patent Number: 5,313,982
[45] Date of Patent: May 24, 1994

[54] GAS SUPPLY PIPING DEVICE FOR A PROCESS APPARATUS

[75] Inventors: Tadahiro Ohmi, 1-17-301, Komegabukuro 2-chome, Aoba-ku, Sendai-shi, Miyagi-ken 980, Japan; Fumio Nakahara; Tuyosi Satoh, both of Sendai; Masaru Umeda, Tokyo, all of Japan

[73] Assignee: Tadahiro Ohmi, Miyagi, Japan

[21] Appl. No.: 121,174

[22] Filed: Sep. 13, 1993

Related U.S. Application Data

[63] Continuation of Ser. No. 922,370, Jul. 29, 1992, abandoned, which is a continuation of Ser. No. 465,226, filed as PCT/JP89/00690, Jul. 7, 1989 abandoned.

[30] Foreign Application Priority Data

Jul. 8, 1988 [JP] Japan .................................. 63-171383

[51] Int. Cl.⁵ ............................................... B08B 9/02
[52] U.S. Cl. ..................................... 137/597; 137/240
[58] Field of Search ......................... 137/884, 597, 240

[56] References Cited

U.S. PATENT DOCUMENTS

| | | | |
|---|---|---|---|
| 4,446,815 | 5/1984 | Kalbskopf et al. | 118/718 |
| 4,714,091 | 12/1987 | Wagner | 137/884 |
| 4,726,399 | 2/1988 | Miller | 137/884 |
| 4,887,645 | 12/1989 | Kerger | 137/884 |
| 4,917,136 | 4/1990 | Ohmi et al. | 137/240 X |

FOREIGN PATENT DOCUMENTS 58-98138 6/1983 Japan .
60-82668 5/1985 Japan .
63-291895 11/1988 Japan .

*Primary Examiner*—John C. Fox
*Attorney, Agent, or Firm*—Baker & Daniels

[57] ABSTRACT

A gas supply pipeline system for process equipment which is adapted to supply at least two kinds of process gas. The system includes two independent flow passages formed between each process gas supply pipeline and a purge gas supply pipeline. The system further includes plurality of flow passages each of which is connected between one of the process gas supply pipelines and the process apparatus. Each of the process gas supply pipelines can be purged independently and the stagnation of gas in the pipelines which are not in use can be prevented by flowing purge gas constantly therethrough.

5 Claims, 33 Drawing Sheets

GAS SUPPLY PIPING DEVICE FOR A PROCESS APPARATUS

This is a continuation of application Ser. No. 07/922,370, filed Jul. 29, 1992, now abandoned, which is a continuation of application Ser. No. 07/465,226, filed as PCT/JP89/00690, Jul. 7, 1989, now abandoned.

TECHNICAL FIELD

The present invention relates to a piping device for supplying process gas of dry etching process for various thin film formations or fine patterns, and particularly relates to a gas supply piping device for a process apparatus, which makes possible high quality film formations and high quality etching.

BACKGROUND TECHNOLOGY

In recent years, in the dry etching process for high quality thin film formations or fine patterns, the ultrapurification of the process atmosphere, i.e. the technique of supplying ultrapure gases to process apparatuses has become very important.

For instance, in the case of semi-conductor devices, to increase the integrity of integrated circuits, the dimension of unit elements has diminished year after year; in order to practidalize semi-conductor devices of 1 micron to the size of submicron, or even smaller than 0.5 micron, research and development are being actively undertaken. The manufacture of this kind of semi-conductor device is carried out by means of repeating formations of thin films and etching these thin films into specific circuit patterns. Then, this kind of process is usually done by putting the silicon wafer in a process reaction chamber and in a reduced pressure atmosphere infused with specific gases. The purpose of putting it in a state of reduced pressure is to control the etching of through holes or conduct holes with high aspect ratio, to lengthen the mean free path of gas molecules for cave filling, and to control gas phase reactions.

If impurities are introduced into the reactive atmosphere during these processes, some problems will result: the degradation of the quality of thin films, incapability to attain accuracy of fine process, a great selective ratio of etching among different materials, and lack of adherence among thin films. In order to fabricate the integrated circuit, having patterns of submicron or low submicron, in high density and high yield on a wafer of large diameter, it is essential to completely control the reactive atmosphere contributing to the formation of thin films and etching. This is the reason why supplying ultrapure gases has become very important.

Gases used in the manufacturing device of semi-conductors include comparatively stable normal gases ($N_2$, Ar, He, $O_2$, $H_2$) and special material gases possessing properties of strong toxicity, self-sustained combustion, and corrosion ($AsH_3$, $PH_3$, $SiH_4$, $Si_2H_6$, HCl, $NH_3$, $Cl_2$, $CF_4$, $SF_6$, $NF_3$, $WF_6$, etc.). As normal gases are easier to handle, they are almost always directly introduced by pressure from the purifying device to the semi-conductor manufacture device. Therefore, through the development and improvement of storage tanks, purifying devices, and piping materials, supplying ultrapure gases to semi-conductor manufacturing devices has become possible. (Ohmi Tadahiro, "A challenge to ppt—a challenge to the concentration of impurities approximating ppt by the gas piping system for semiconductors." *Nikkei Microdevice*. July 1987, pp. 98–119.) On the other hand, for special material gases, as careful attention is needed in handling them, the quantity used is very small in comparison to normal gases; therefore, gases in the cylinder are introduced by pressure to the semi-conductor manufacturing device through a cylinder-cabinet piping device.

Up to now, the most serious problem in the ultrapurification of gases supplied from the cylinder through the cylinder-cabinet piping device is the dirt inside the cylinder itself, the existence of large external leakage in the joint of the cylinder-valve and the cylinder, as well as pollution caused by productive absorbing gases, which are engendered because the inside of the cylinder is not accessible to cleaning. However, this problem is also almost overcome by treating the inside to become a specular surface of no processing deterior layer by means of complex electropolish, and the development of cylinder-valves having external threads and which use MCR (Metal C Ring fitting) with built-in purge valves (Ohmi Tadahiro, Murota Junishi. "Technique of Cleaning Bombs and Filling Gases." The Sixth VLSI Ultracleaning Technology—Symposium. A Collection of Drafts "High Performance Process Techniques III." January 1988, pp 109–128). In addition, all the pipelines of the cylinder-cabinet piping device which contains the gas cylinder and supply process gas are double sealed against the atmosphere; moreover, the purge gas supply pipes are devised in a structure purgeable at any time; the realization of such devices to suppress the pollution caused by the entrance of the atmosphere into the pipeline system or by gases chiefly released from water moisture in the internal walls of the pipeline material makes the supply of ultrapure gases possible.

In general prior art, when one kind of gas is supplied to one process apparatus from one gas cylinder, there are few problems because the purging gas supplied to the cylinder-cabinet pipeline device purges the process gas supply pipeline as well as the process gas supply and control pipeline in the process apparatus. However, when using a device for various gases (e.g. reactive ion, etching device (RIE), electronic cyclotron resonance device (ECR), low pressure chemical vapor deposition device (LPCV)), one kind or several kinds of process gases must be selected and mixed from the various process gases before transporting them to the process device. Under this circumstance, when selecting and mixing process gases, if some process gas is left behind in the process gas supply and control pipeline, then replacement of process gas will not take place in that part, hence reducing the degree of purity of the process gas to be supplied to the process device. Besides, although there is no problem concerning the process gas supply and control pipeline when it is used to supply process gas to the process device, the process gas supply and control pipeline is oftentimes in a state of sealing in gases when it is not used to supply process gas; therefore, it will be polluted by the gas chiefly released from water moisture in the inside of the pipeline; and when the process gas supply and control pipeline is used again, this will become the reason for the reduction in the degree of purity of the process gas supplied.

In this way, if the flowing of gas stops and residual gas exists in the gas piping system, it occurs to pollute the piping system and to reduce the purity of the supplied gas. As a result, the process will be tremendously affected.

For instance, the most recently developed DC-RF coupled mode bias sputtering device can also obtain an excellent Al thin film of specular surface with entirely no hillock, even after a heat treatment of 400° C. (T. Ohmi, H. Kuwabara, T. Shibata and T. Kiyota. "RF-DC Coupled Mode Bias Sputtering for ULSI Metalization." Proc 1st Int. Symposium on UltraLarge Scale Integration Science and Technology. May 10-15, 1987. Philadelphia; and Ohmi Tadahiro. "Thorough Elimination of Impurities, Grasping the Conditions for Al Film Formation Without Hillocks." *Nikkei Microdevice*. October 1987, pp. 109-111). When Al film is formed using this device, it is understood that only when the amount of water moisture contained in Ar is suppressed to below 10 ppb, then the optimum manufacturing conditions for Al film formation can be found out. If Ar Sputter atmosphere contains more than 10 ppb of water moisture, the morphology on the surface of the Al film will degrade. Under this circumstance, the parameter of Al film formation with the resistivity equals to Al bulk and without hillocks after being subject to heat treatment is impossible to be obtained.

In addition, in the method of reducing pressure CVD, if ultrapure $SiH_4$, $H_2$, and $N_2$ containing less than 10 ppb of water moisture are used to engage in thin film formation, and when the absorbing water on the surface of the wafer is suppressed to become very small in quantity, even when under the practical conditions (temperature: 650° C., pressure: a few Torr) wherein there was previously no selective growth nor epitaxial growth in the thin film formation, selective growth and epitaxial growth can be seen. That is, the epitaxial growth of Si on clean Si surface can also be obtained; the film formation of polysilicon above $SiO_2$ can be suppressed to very few (Murota Junichi, Namamura Naoto, Kato Manabu, Mikoshiba Nobuo, and Ohmi Tadahiro. "An Ultracleaning CVD Technique Having High Selectivity." The Sixth ULSI Ultracleaning Technology—Symposium. A Collection of Drafts "High Performance Process Techniques III." January 1988, pp. 215-226).

FIG. 31(a) through (c) is a most preferred embodiment of the known gas supply pipeline of the process apparatus which supplies a number of process gases to the process apparatus.

A brief description of the above is given with reference to FIG. 31(a). For simplicity sake, FIG. 31(a) shows three kinds of process gas are supplied to the process gas supply piping device for the process apparatus. In FIG. 31(a), 601 is the reaction chamber of the process apparatus, which is connected with the vacuum exhaust device. 608, 609, 610, 614, 615, 616, 617, 618, 619, 629, 630, 631, 632, 633, 634, 635, 636, 637, 643, 644, 648, 649, 650, 652, 653, 654, 658, 659, and 663 are stop valves; among these, 614 and 617, 615 and 618, 616 and 619, as well as 653 and 654 are respectively 3-way dual valves integrating two valves into one. 602, 603, and 604 are process gas supply pipelines, which usually carry the process gas filled in the cylinder or gases for purging pipelines (e.g. Ar) from the cylinder-cabinet pipeline device to the process device pipelines. 611, 612, and 613 are pressure regulators. 620, 621, and 622 are mass flow controllers. 623, 624, and 625 are gas filters. 655 and 660 are spiral pipes for preventing the entrance of atmosphere by reverse diffusion through the blowoff opening for purge gases. 656 and 661 are needle valves for controlling the flow of purge gases. 657 and 662 are floater flow meters. Pressure regulators 611, 612, and 613, mass flow controllers 620, 621, and 622, and gas filters 623, 624, and 625, all these constitute the process gas control pipelines. The number of process gas control pipelines is the same as that of the process gas supply piping lines. 638, 639, 645, 646, and 647 are process device piping lines, the piping system introducing process gas to the process device. 626, 627, and 628 are bypass lines, 640, 641, 642, and 651 are the exhaust pipelines for purge gas and vacuum exhaust pipelines of gas piping, 605 and 606 are purge gas exhaust pipelines, 607 is a vacuum exhaust pipeline, these are severally connected to the exhaust duct or the exhaust device. Generally, these piping lines are composed of ¼" electropolished SUS 316L pipes.

Next, the function and the operation of the apparatus shown in FIG. 31 (a) are described with reference to FIG. 31 (b) through (f). Here, the supply of process gas from the process gas supply piping line 602 to the reaction chamber 601 is used as an example, and its operation is separately explained in points (1) to (5).

(1) When the Device Stops

As a general rule, when the process device is not used for the process gas, as shown in FIG. 31 (b), and when stop valves 608, 609, 610, 614, 615, 616, 617, 618, 619, 629, 630, 631, 635, 636, 637, 643, 644, 648, 649, 650, 654, 658, 659 and 663 are all in an open state, and stop valves 632, 633, 634, 652 and 653 are all in a closed state, the purge gas (e.g. Ar) passes from the process gas supply piping lines 602, 603, and 604 through needle valves 656 and 661 for flow regulation to the front of the reaction chamber of the process device; and all this time the purge gas inside the piping system is constantly flowing. The thick lines represent the flow of the gas.

(2) When Process Gas Is Substituted for Purge Gas

Next, in order to supply ultrapure process gas to the process apparatus, the operation of substituting the residual purge gas (e.g. Ar gas) in the supply piping system with process gas is carried out. First of all, from the state as shown in FIG. 31(b), close valves 658, 663, 654, 656, 659, and 661, then close valves 635, 636, 637, 649, and 650, and stop the supply of purge gas (e.g. Ar) from the process gas supply piping line 602. Subsequently, open valve 653, the process gas passes through the reaction chamber 601 to proceed with the vacuum exhaust discharge in process gas supply pipelines 638, 639, 645, 646, and 647; open valves 632 and 652, and use the vacuum exhaust pipeline 607 to engage in vacuum exhaust discharge in piping lines 626 and 640 as well as the piping lines of the cylinder-cabinet piping device (FIG. 31(c)). And valve 635 is in its original close state. After the degree of vacuum inside the piping lines reaches a degree of, say, $1 \times 10^{-2}$ Torr, close valves 648 and 653. Then, open valve 635, and supply process gas from the process gas supply piping line 602 to fill the piping system with process gas (FIG. 31(d)). Next, stop the supply of process gas, open valves 648 and 653, and allow vacuum exhaust discharge, the same vacuum exhaust discharge for purge gas, to take place in the piping system (FIG. 31(c)). This supply of process gas from the process gas supply pipeline 602 and the vacuum exhaust discharge in the piping lines are generally repeated more than five times, and then close valves 608, 614, 617, 629, 632, 643, 644, 648, and 653.

(3) The Supply of Process Gas

After the above-mentioned operation, with valves 608, 617, 635, 643, 644, and 653 in their open state, regulate the supply pressure and flow of process gas by means of the pressure regulator 611 and the mass flow controller 620 and supply the process gas to the reaction chamber 601. Then close valve 652, open valves 649, 650, 659, 661, and 663, and begin anew the purging of piping lines 603 and 604, which have not supplied process gas. This state is as shown in FIG. 31(e).

(4) Stopping the Supply of Process Gas

Following, the method of stopping the supply of process gas is described. This operation is similar to that of the supplying process gas; not that process gas will substitute for purge gas, but that purge gas (e.g. Ar) will substitute for process gas. The supply of purge gas and the vacuum exhaust discharge in the piping lines are usually repeated more than five times in this operation. Then, close valves 608, 614, 617, 629, 632, 635, 643, 644, 648, 652, and 653, and supply purge gas from the process gas supply piping line 602. Next, open valves 608, 614, 617, 629, 635, 643, 644, 648, 654, 656, 658, 659, 661, and 663, and begin purging (FIG. 31(f)). When purging starts again from the system of piping lines 603 and 604, the state shown in FIG. 31(b) is obtained.

However, although, in the apparatus shown in FIG. 31(a), for instance, when process gas from the process gas supply pipeline 602 is supplied or checked, the substitution of purge gas with process gas or the substitution of process gas with purge gas is taking place. At this time piping lines 627, 641, 628, and 642 in the other cylinder gas cabinet piping devices 603 and 604 should allow no passage of purge gas, and they should be completely closed (FIGS. 31(c) (d)). Furthermore, when the process gas supply piping line 602 is supplying process gas, though purge gas is flowing in the piping system of the process gas supply piping lines 603 and 604, piping lines 626 and 640 for discharging exhaust of purge gas of the process gas supply piping line 602 and for vacuum exhaust discharge of the gas pipelines must be thoroughly closed (FIG. 31(e)). In this way, under the condition that the gas supply piping system is completely closed, the inside of the system will be contaminated by gas released chiefly from water moisture in the inner walls of the piping material.

FIG. 32 shows the dew point change in this kind of gas piping system when the system is practically sealed. In the system wherein the dew point has already been lowered to −98° C. by means of subjecting the supply piping system to baking or the like, under the condition that gas is reintroduced 9 days after stopping the supply of gas, the dew point of the gas will rise to −42° C., and 3 days are needed for it to resume its former value. Therefore, closing the gas supply piping system will pollute the inside of the piping system, hence becoming a big problem for the process apparatus of the gas supply system which requires ultrapure gases.

Furthermore, in the apparatus shown in FIG. 31(a), when supplying process gas from process gas supply piping line 602 (FIG. 31(e)), process gas supply piping lines 638 and 639 of the process gas supply piping lines 603 and 604 will become the dead zone for the gas, and hence no exchange of gas can take place, causing the reduction of the purity of the process gas supplied. Moreover, when supplying process gas from the process gas supply piping line 604, not only the piping lines 628 and 642, which are used for exhaust discharge of purge gas and vacuum exhaust discharge of the gas pipelines, but the process gas supply piping lines 638, 639, 645, and 646 are also closed; therefore, the pollution inside the pipelines becomes more severe (FIG. 31(g)). The known technique as described above illustrates the situation wherein there are three process gas supply piping lines; in real installation, the number is much greater, and hence the effect of pollution becomes worse.

Therefore, for a piping system which supplies a number of process gases to one single process apparatus, it is hoped that there is a systematic technique wherein purging and vacuum exhaust discharge can take place independently in each process gas supply pipeline and each piping line of the process apparatus, no dead zone of gas is created in the confluent part of each process gas supply piping line, and purge gas can be flowed continuously through an unused piping system.

In view of the above, the primary object of the present invention is to offer a gas supply piping system for a process apparatus of a structure wherein, when supplying a number of process gases to a process apparatus, residence of gas is completely absent in the piping system, and purging as well as vacuum exhaust discharge can independently proceed within each process gas supply piping system.

DISCLOSURE OF THE INVENTION

The first aspect of the present invention is a gas supply piping device for a process apparatus comprising: at least two process gas supply piping lines with one end connected to the gas supply source; a purge gas piping line, with one end connected to the purge gas exhaust discharge system and the other end joined to the other end of the above-mentioned process gas supply piping line by means of a valve; and a process apparatus piping line, with one end connected to each process gas supply piping line mentioned above and the other end connected, by means of a valve, to the process apparatus which treats process gas from the above-mentioned gas supply source; and being characterized in comprising: at least two valves which are mounted on a separately independent flow path different from the above-mentioned flow path formed in between the other end of each process gas supply piping line mentioned above and the other end of the purge gas piping line mentioned above; at least two valves which are mounted on a number of flow paths different from the above-mentioned flow path formed in between the other end of each process gas supply piping line mentioned above and one end of the process apparatus piping line mentioned above.

As in the first aspect, the second aspect of the present invention is characterized in that the purge gas piping line mentioned above is connected to the exhaust pipeline by means of at least one flow meter and at least one flow control valve.

As in the first and second aspects, the third aspect of the present invention is characterized in that the at least two valves separately provided in independent flow paths mentioned above and the at least two valves provided in a number of flow paths mentioned above are an integrally formed monoblock valve.

As in the third aspect, the fourth aspect of the present invention is characterized in that the number of the above-mentioned monoblock valves is no less than that which is less than that of the process gas supply piping lines mentioned above by one.

FUNCTIONS

That is, the present invention is a gas supply piping device for a process apparatus, which supplies a number of process gases to one single process apparatus. It is a structure capable of constantly purging the gas supply piping lines of the process apparatus when they are not supplying process gases and are in a stop; furthermore, the bypass pipelines of the gas control pipelines of the process apparatus are a structure of extremely few dead zones for the gas; therefore, there is always gas flowing in all the gas supply piping lines, and thus it is a gas piping device of a process apparatus wherein the gas dead zones are extremely few.

Further, by using at the same time, the gas supply piping device of a process apparatus of the present invention, the newly developed clean gas cylinder for semi-conductors (Japan Patent No. 52-5389), cylinder gas cabinet piping device (Japan Patent No. 52457), and process gas supply piping system (Japan Patent No. 111152), ultrapure process gases containing less than 10 ppb of water moisture can be supplied to a number of process apparatuses constantly.

The newly developed clean gas cylinder for semi-conductors referred to herein is a device to be described hereinbelow.

1. A device whose major part is made of stainless steel, at least a part of the above-mentioned stainless steel surface exposed herein the internal part of the device being constituted of two layers, a layer whose main component is the oxide of chrome, formed from near the interface of the stainless steel and the passive state film, and a layer whose main component is the oxide of iron, formed near the surface of the passive state film, with the passive state film having a thickness above 50 Å and formed by heating oxidation of stainless steel at a temperature of above 150° C. but below 400° C.

2. A device whose major part is made of stainless steel, at least a part of the above-mentioned stainless steel surface exposed herein the internal part of the device having a passive state film of a thickness above 100 Å formed from a layer whose main component is the mixed oxides of the oxide of chrome and the oxide of iron, the passive state film being formed by heating oxidation of stainless steel at a temperature above 400° C. but below 500° C.

3. A device whose major part is made of stainless steel, at least a part of the above-mentioned stainless steel surface exposed herein the internal part of the device having a passive state film of a thickness above 130 Å formed from a layer whose main component is the oxide of chrome, the passive state film being formed by heating oxidation of stainless steel for over 9 hours at a temperature above 550° C.

In particular, it is preferrable that the surface of the stainless steel which forms the passive state film has an evenness wherein the maximum value of the difference in height between the convex and concave in a perimeter of a radius of 5 m is below 1 m.

In this new technique, by using the clean $SiH_4$ and $Si_2H_6$ gases of few impurities obtained by the present invention, the epitaxial growth temperature of Si can be lowered to 600° C., and for the accumulation the silicone on Si and $SiO_2$, a high selectivity can be obtained (Morita Mizuho, Kohchi Tetunobu, Ohmi Tadahiro, Kumagai Kohyo, Itohmasaki. "CVD Technique of Free Molecule Flow, Irradiating-Type, Low Temperature, high speed." The Sixth ULSI Ultracleaning Technology—Symposium. A Collection of Drafts "High Performance Process Technique III." January 1988, pp. 229–243, and Murota Junichi, Nakamura Naoto, Kato Manabu, Mikoshiba Nobuo, and Ohmi Tadahiro. "An Ultracleaning CVD Technique Having High Selectivity." pp. 215–226). Thus, through cleaning the raw material gas supply system completely, high quality film formations and high quality etching are possible.

In the following, an embodiment of the present invention will be described in detail with the drawings.

DESCRIPTION OF THE APPARATUS

The best mode for the practice of the present invention

First preferred embodiment

Figure 1:
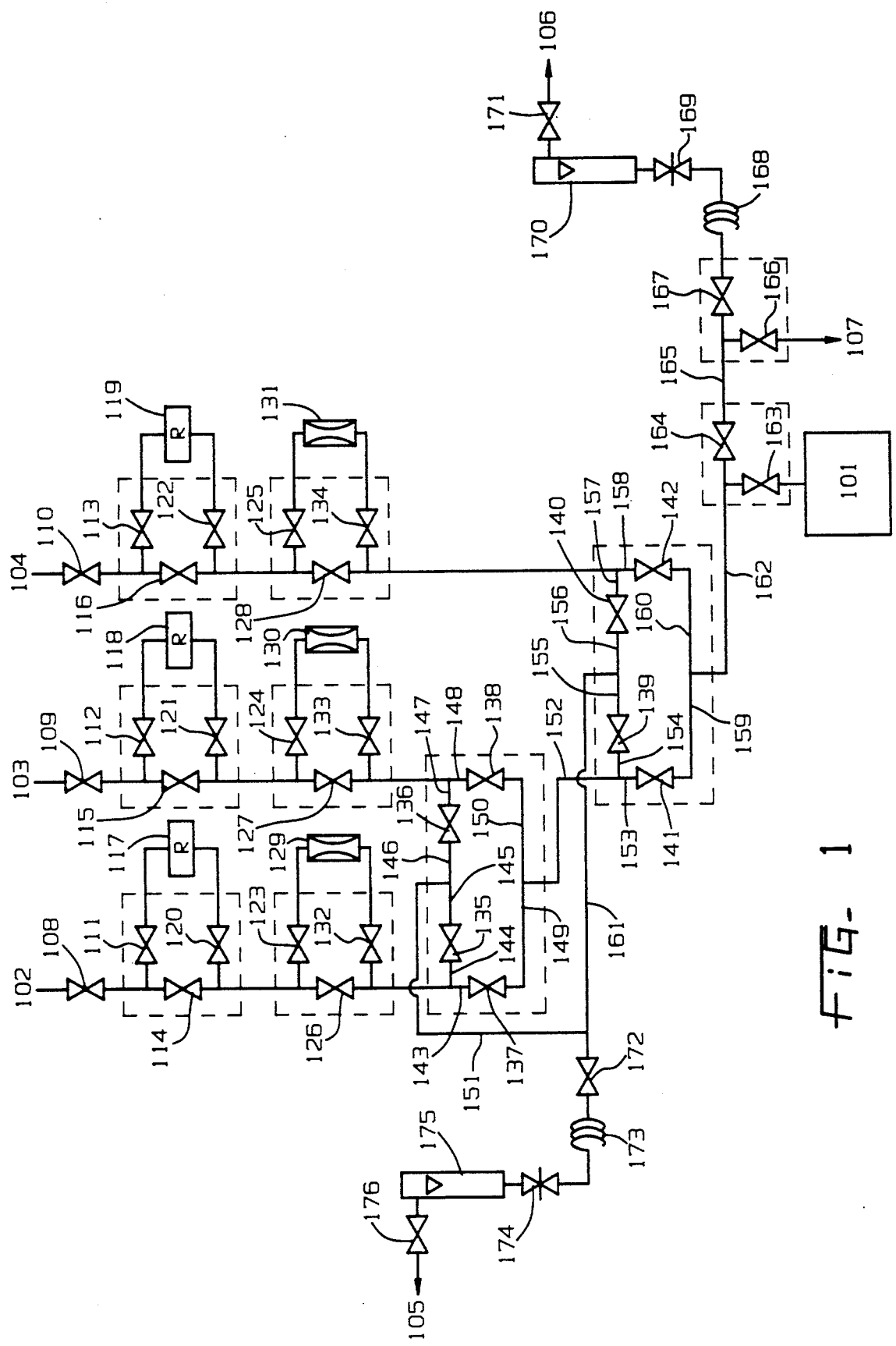
FIG. 1 is a block diagram showing the first preferred embodiment of the piping system of the present invention.

FIG. 1 is a piping arrangement diagram of the gas supply piping device for a process apparatus showing the first preferred embodiment of the present invention. For simplicity sake, this preferred embodiment only shows the condition of supplying three kinds of process gas; the gas control pipeline of the process apparatus is also simplified. 101 is the reaction chamber of the process apparatus, which is connected to the vacuum exhaust device (not shown). To use the reaction chamber 101 as the vacuum exhaust device for vacuum exhaust discharge, it is preferrable to use a turbo molecular pump of an oil-free, magnetic floating type so as to prevent the reaction chamber from being polluted by oil. 102, 103 and 104 are process gas supply piping lines; usually they are pipelines for supplying the process gas filled in the cylinder and the purge gas (e.g. Ar), etc. in the gas piping system from the cylinder-cabinet piping device to the pipelines of the process apparatus. 105 and 106 are exhaust discharge pipelines for the purge gas, which are connected to the exhaust duct (not shown). 107 is the vacuum exhaust pipeline, which is connected to the vacuum exhaust device (not shown). 108, 109, 110, 111, 112, 113, 114, 115, 116, 120, 121, 122, 123, 124, 125, 126, 127, 128, 132, 133, 134, 135, 136, 137, 138, 139, 140, 141, 142, 163, 164, 166, 167, 171, 172, and 176 are stop valves, among these, the combinations of stop valves 111, 114, 120, stop valves 112, 115, 121, stop valves 113, 116, 122, stop valves 123, 126, 132, stop valves 124, 127, 133, and stop valves 125, 128, 134 are monoblock valves which integrate three valves into one and minimize the dead zones; especially valves 114, 115, 116, 126, 127, and 128, they themselves have the function of a bypass line. In addition, the combinations of stop valves 135, 136, 137, 138, and stop valves 139, 140, 141, 142 are monoblock valves which integrate four valves into one and minimize the dead zones. Furthermore, 163 and 164, as well as 166 and 167 are respectively 2-valve integrated 3-way dual valves 117, 118 and 119 are pressure regulators. 129, 130 and 131 are mass flow controllers, which can also be floater flow meters attached with needle valves. Besides, although it is not shown in FIG. 1, according to need, it is also possible to utilize a 3-valve-integrated monoblock valve to mount the gas filter in the same way as mounting the pressure regulator or the mass flow controller. In the mounting of the gas filter, for one single process gas supply piping system, it is also possible to use one or two units of 4-valve-integrated monoblock valves to mount two gas filters. This will be explained later. 169 and 174 are needle valves. 170 and 175 are floater flow meters, these are respectively integral flow meters with needle valves too, and can also be used as mass flow controllers. The above-mentioned component materials must cause no external leakage and must not produce particles, and the gas released should be the least. Therefore, internally electropolished components are desired. 129, 130, and 131 make up the gas control pipeline of the process apparatus. Gas control pipelines of the process apparatus are separately provided at process gas supply piping lines 102, 103, and 104. 168 and 173 are spiral pipes for preventing the entrance of atmosphere by reverse diffusion through the blowoff opening for purge gases, and $\frac{1}{4}''$ internally polished SUS 316L pipe with length above 4 m is preferred. 143, 144, 147, 148, 149, 150, 152, 153, 154, 157, 158, 159, 160, and 162 are piping lines of the process apparatus, the piping system introducing process gas into the process apparatus. 145, 146, 151, 155, 156, and 161 are purge gas pipelines of the process apparatus. 165 is a piping line for the vacuum exhaust discharge of the gas pipelines and for purging. According to the quantity of gas used, these separate pipelines can be constructed by using, for example, internally electropolished SUS 316L pipes of $\frac{1}{4}''$ or $\frac{3}{8}''$. If the flowing gas contains corrosive chlorine or fluorine, it is also effective to use Ni pipeline. In addition, for simplicity sake, two purge gas pipelines of the process apparatus, 151 and 161. are integrated into one for exhaust discharge; or a single pipeline can be used for discharging exhaust.

Figure 2:
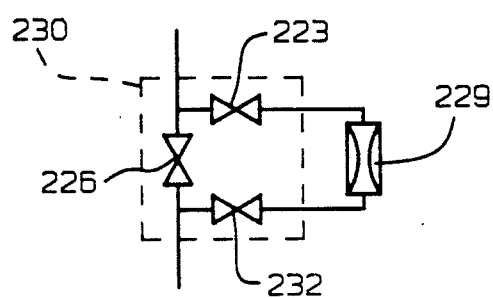
FIG. 2 is a fragmentary enlarged lock diagram showing the 4-way treble valve as in the above first preferred embodiment.

FIG. 2 is an example of the monoblock valve 230 used in this embodiment. Three valves, 223, 226, 232 are integrated into one, and in between valves 223 and 232 is provided with a mass flow controller 229. This monoblock valve 230 does not become the dead zone of the gas, but is a high performance valve that can form a bypass.

Figure 3:
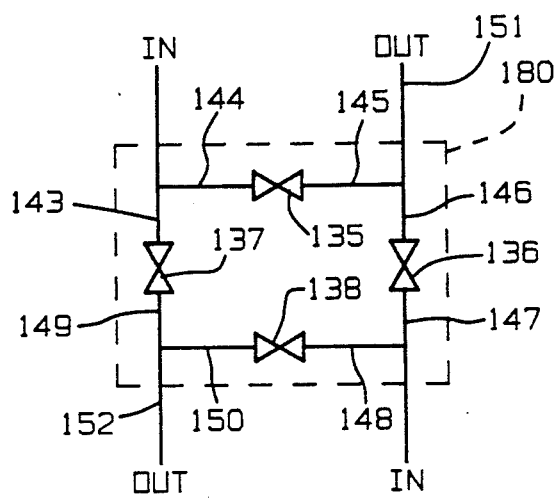
FIG. 3 is an fragmentary enlarged block diagram showing the 4-way quadruple valve used in the present invention.

FIG. 3 is a diagram of one of the 4-valve-integrated monoblock valves used in the present invention. The piping lines 143 and 144, 145 and 146, 147 and 148, and 149 and 150 of the confluent part of the process gas become extremely small by being made into monoblocks; therefore, the reduction of the purity of the process gas created as a result of the dead zones of the gas within the valves can be suppressed to a minimum. Hence, such monoblock valve is a high performance valve which is characterized in that it can supply 2 kinds of process gas independently to 2 piping lines of the process apparatus with no reduction of the purity of the highly pure process gas.

A connection example showing the state of connecting filters

Furthermore, by means of combining these two kinds of monoblock valves, 2 gas filters can be used, being a construction that when one of the gas filters is being used to supply process gas, another gas filter is heated and purged by a heater or the like; therefore, while one gas filter is being used, the other gas filter can be regenerated at any time.

Below, using FIG. 4 through FIG. 9, an explanation is given in respect to the piping system using two filters and the above-mentioned monoblock valve.

Figure 4:
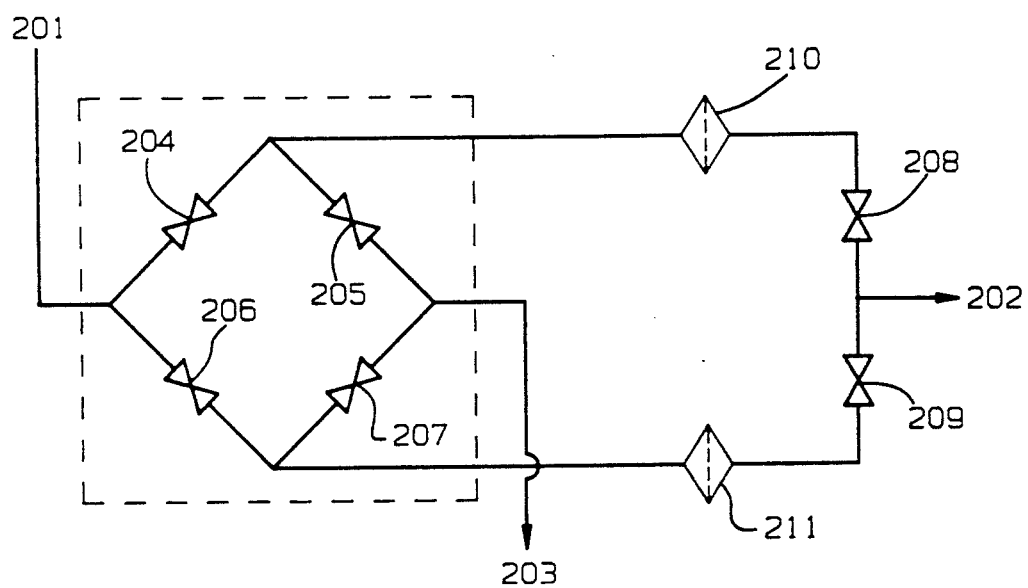
FIG. 4 and FIG. 7 are diagrams illustrating the connection of the gas filter pipelines of the gas piping lines of the process apparatus.

FIG. 4 indicates the embodiment of the above piping system. 201 is a piping line from the process gas supply piping line. It is connected to valves 111, 112, 113, 123, 124, 125 of the 3-valve-integrated monoblock valves, as shown in FIG. 1. 202 is a piping line leading to the process apparatus, which is connected to valves, 120, 121, 122, 132, 133, 134 of the 3-valve-integrated monoblock valves, as shown in FIG. 1. 203 is a piping line leading to the purge gas exhaust pipeline, which is connected to the exhaust duct via the needle valve and the flow meter. 204, 205, 206, 207, 208 and 209 are stop valves; among these, valves 204 and 205, and valves 206 and 207 are 4-valve-integrated monoblock valves, which are similar to those shown in FIG. 3. 210, 211 are gas filters.

Figure 5:
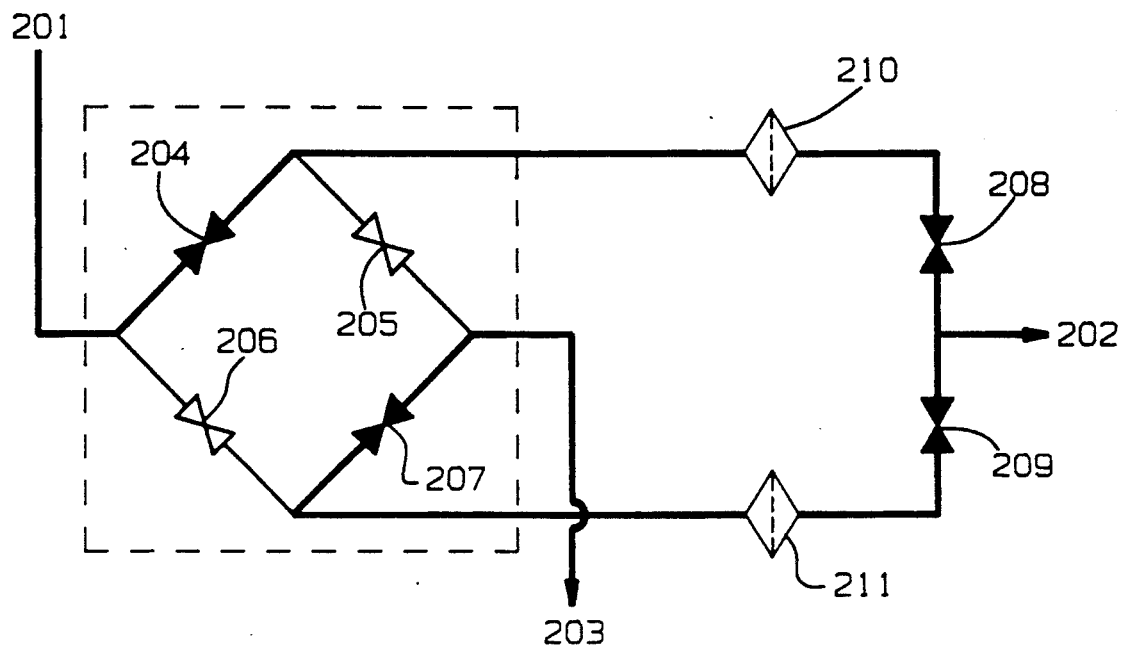
FIG. 5, FIG. 6, FIG. 8, and FIG. 9 are diagrams illustrating the operation of the gas filter piping as shown in FIG. 4 and FIG. 7.
Figure 6:
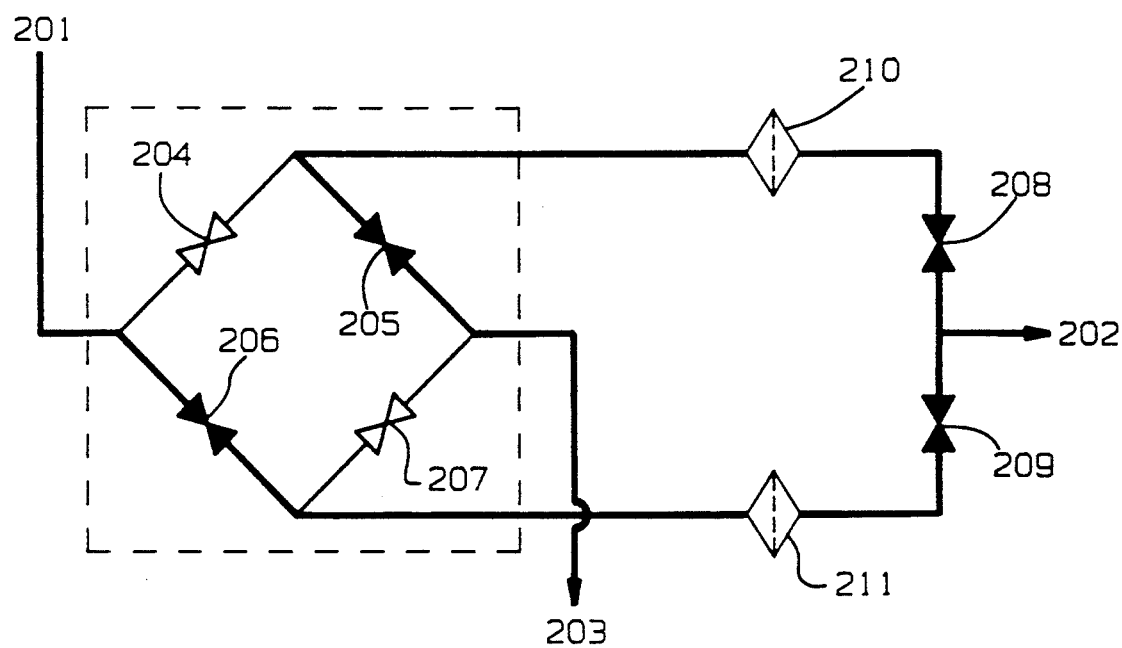

Reference is made to FIG. 5 and FIG. 6 to illustrate the method of operation. When using gas filter 210 and purging gas filter 211, open valves 204, 207, 208, 209, close valves 205, 206, heat gas filter 211 with a heater or the like. At this time the flow of gas is as shown in FIG. 5. Further, when using gas filter 211 and purging gas filter 210, open valves 205, 206, 208, 209, close valves 204, 207, heat gas filter 210 with a heater or the like. At this time the flow of gas is as shown in FIG. 6. With such method, as the regeneration of the gas filter is carried out using the process gas, although it is not necessary to consider the substitution of gas within the gas filter, this method cannot be applied when, because of various reasons, the flow of process gas cannot be supplied in a large quantity.

Following, a connection example when regenerated gas is separately supplied is illustrated with reference to FIG. 7 through FIG. 9.

Figure 7:
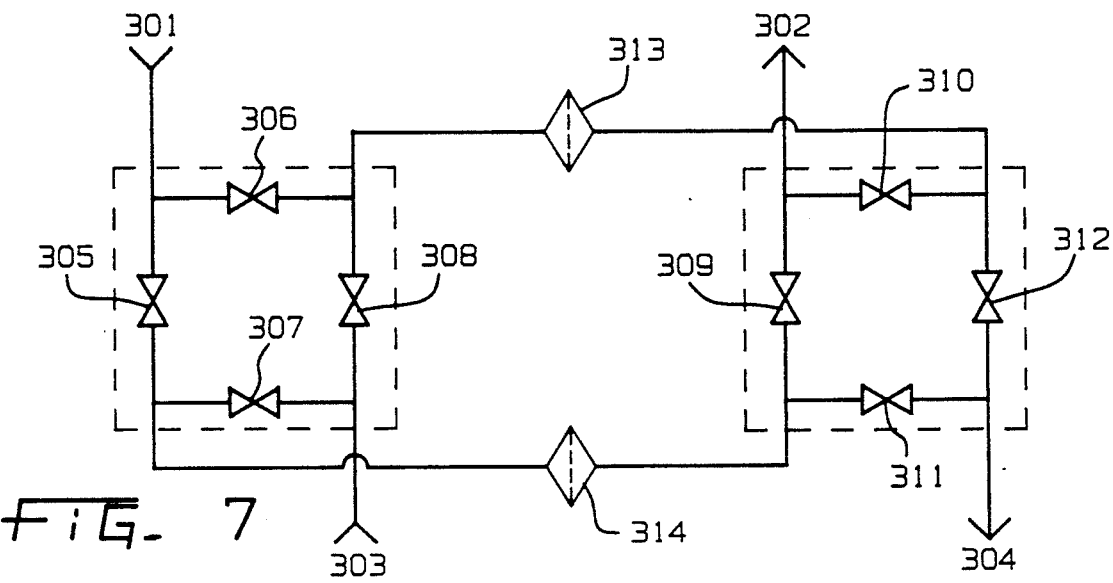

FIG. 7 is a connection example of the above-mentioned piping system. 301 is a pipeline from the process gas supply piping line, which is connected to valves 111, 112, 113, 123, 124, 125 of the 3-valve-integrated monoblock valves shown in FIG. 1. 302 is a piping line leading to the process apparatus, which is connected to valves 120, 121, 132, 133, 134 of the 3-valve-integrated monoblock valve shown in FIG. 1. 303 is a purge gas supply pipeline, which is connected to the exhaust duct via the needle valve and the flow meter. 305, 306, 307, 308, 309, 310, 311, 312 are stop valves; among these, 305, 306, 307, 308, and 309, 310, 311, 312 are 4-valve-integrated monoblock valves, and are similar to those shown in FIG. 3. 313, 314 are gas filters.

Figure 8:
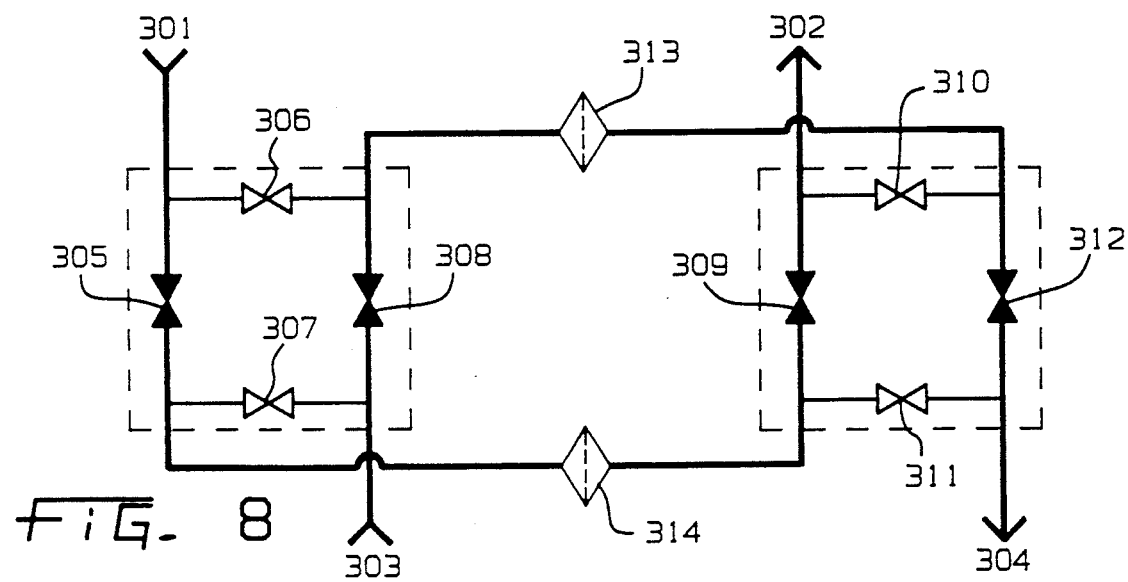
Figure 9:
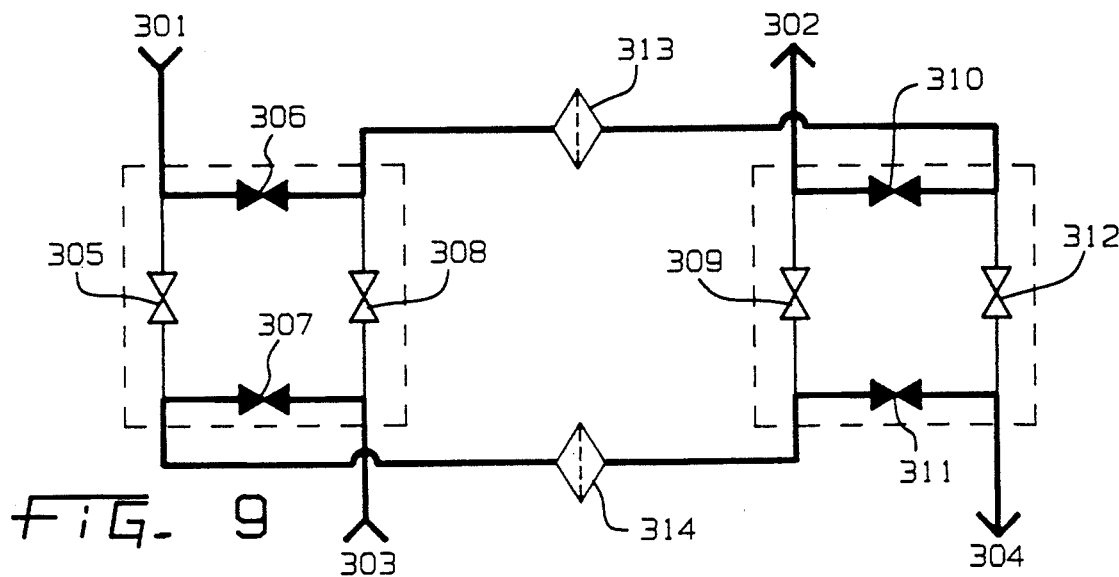

The method of operation is explained using FIG. 8 and FIG. 9. When using gas filter 314 and purging gas filter 313, open valves 305, 308, 309, 312, close valves 306, 307, 310, 311, heat gas filter 313 with a heater or the like. At this time the flow of gas is as shown in FIG. 8. When using gas filter 313 and purging gas filter 314, open valves 306, 307, 310, 311, close valves 305, 308, 309, 312. Heat gas filter 314 with a heater or the like. At this time the flow of gas is as shown in FIG. 9. With such method, because the regeneration of gas filter is carried out using a purge gas which is different from process gas gas, although the flow rate of the gas for regeneration can be maintained, due to the passage of a gas different from the process gas through the gas filter, it is necessary to sufficiently carry out the substitution of the gas within the gas filter. The method of operation Next, FIG. 10 through FIG. 28 illustrate the method of operation of the gas supply piping device for a process apparatus as shown in FIG. 1.

When the operation stops

Figure 10:
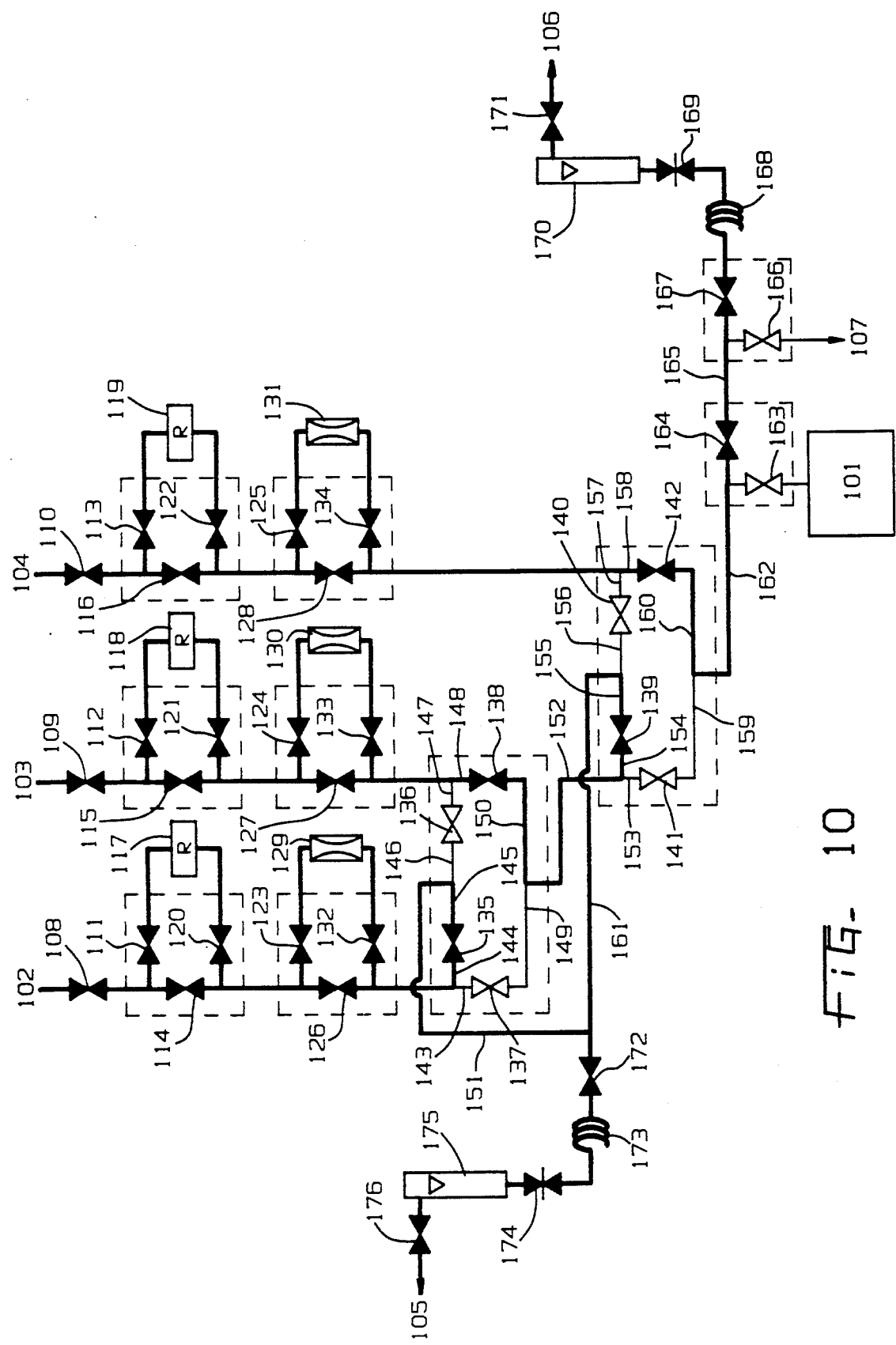
FIG. 10 through FIG. 28 are diagrams illustrating the operation of the preferred embodiment as shown in FIG. 1.
Figure 11:
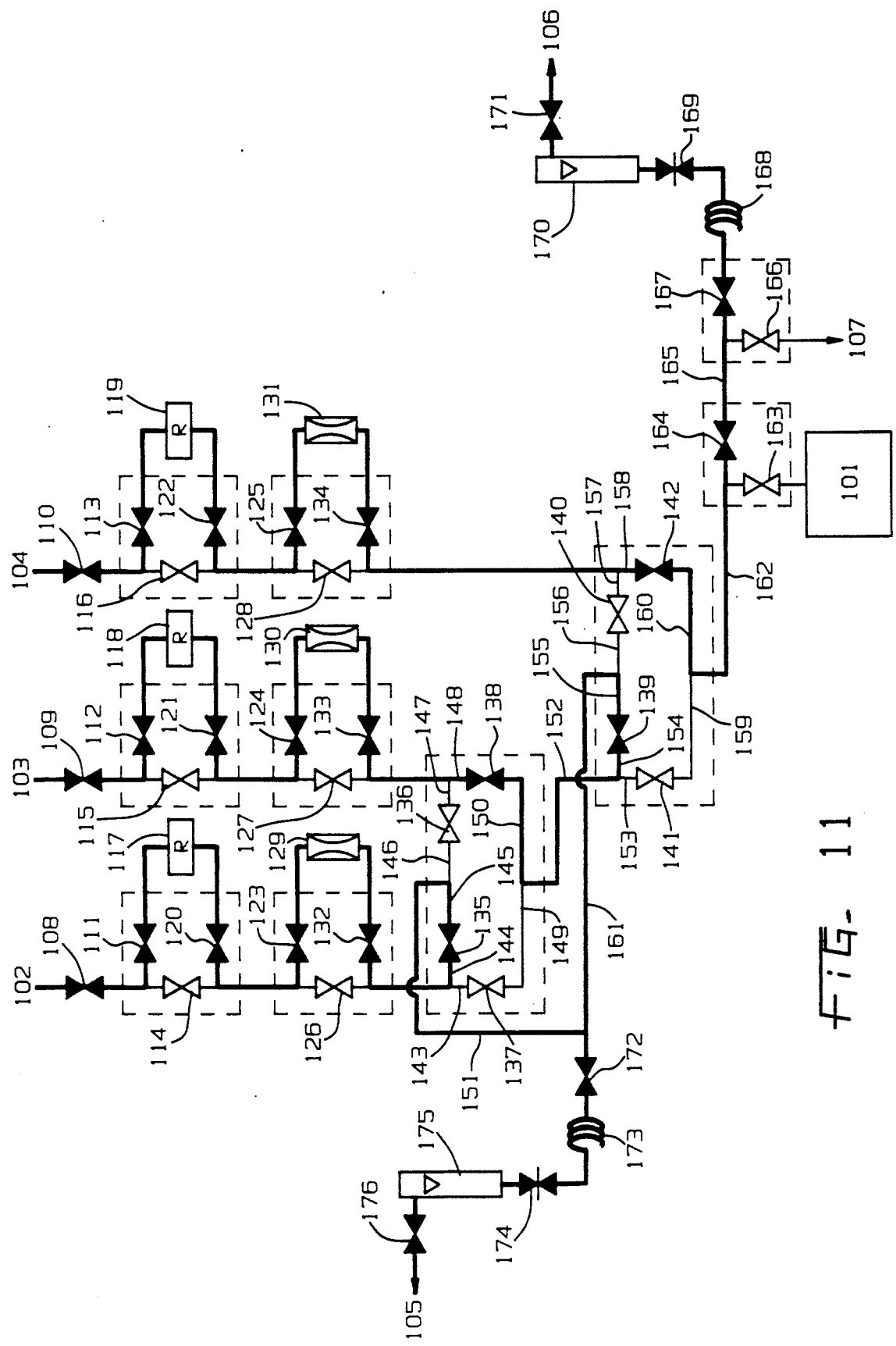

FIG. 10 and FIG. 11 illustrate the flow of the purge gas (e.g. Ar, etc.) when the process gas is not used. The flow of the gas is represented by thick lines. When the apparatus has been installed, the dew point of the gas system is high. To decrease the water moisture within the wall of the piping earlier, as shown in FIG. 10, in the state wherein valves 108, 109, 110, 111, 112, 113, 114, 115, 116, 120, 121, 122, 123, 124, 125, 126, 127, 128, 132, 133, 134, 135, 138, 139, 142, 164, 167, 171, 172, and 176 are all open, and valves 136, 137, 140, 141, 163, and 166 are all closed, using needle valves 169 and 174 to regulate the flow rate of each process gas to reach a degree of 20 l/min, supply the purge gas (e.g. Ar etc.) from process gas supply pipine lines 102, 103, and 104 to the reaction chamber of the apparatus; abundant gas is used to carry out the purging within the piping system. By means of this, when the dew point reaches a degree of $-80°$ C., for instance, in the state wherein valves 108, 109, 110, 111, 112, 113, 120, 121, 122, 123, 124, 125, 132, 133, 134, 135, 138, 139, 142, 164, 167, 171, 172, and 176 are all open, and valves 114, 115, 116, 126, 127, 128, 136, 137, 140, 141, 163, and 166 are all closed, using needle valves 169 and 174 to regulate the flow rate, supply purge gas (e.g. Ar, etc.) from process gas supply piping lines 102, 103, and 104 to the front of the reaction chamber of the apparatus as shown in FIG. 11. Then proceed with the purging of the pressure regulators, mass flow controllers and filters, etc., in which, compared to the pipelines, impurities such as water of the inner walls do not fall off easily. And when the dew point of the gas system has reached a degree of $-100°$ C., start using process gas. Further, during the process of purging, heating pipelines, valves, mass flow controllers, and filters with a heater or the like, and carrying out purging at a temperature of 100° C. are effective to both the detachment of impurities within the gas system and the lowering of the dew point. After the use of process gas is started, in the state wherein valves 108, 109, 110, 111, 112, 113, 120, 121, 122, 123, 124, 125, 132, 133, 134, 135, 138, 139, 142, 164, 167, 171, 172, and 176 are all open, and valves 114, 115, 116, 126, 127, 128, 136, 137, 140, 141, 163, and 166 are all closed, using needle valves 169 and 174 to regulate the flow rate to, say, a degree of 1 l/min., constantly supply purge gas (e.g. Ar, etc.) from the process gas supply piping lines 102, 103, 104 to the front of the reaction chamber of the apparatus. Through continously purging the whole gas piping system, the purity of the gas system can be maintained.

In the above-mentioned examples, valves, 135, 136, 137, 138, and valves 139, 140, 141 and 142 of the 4-valve-integrated monoblock valves are being purged, when valves 135, 138, 139, and 142 are all open, and valves 136, 137, 140, and 141 are all in a closed state. In addition, purging can also take place in the state wherein valves 136, 137, 140 and 141 are all open, and valves 135, 138, 139, and 142 are all closed; valves 135, 138, 140, and 141 are all open, valves 136, 137, 139, and 142 are all closed; or valves 136, 137, 139, and 142 are all open, valves 135, 138, 140, and 141 are all closed.

Following, using FIG. 12 through FIG. 23, the supply of process gas is explained. The thick lines represent the pipelines wherein gases flow.

First of all, the operation of the supply of one kind of gas to the reaction chamber 101 of the process apparatus is illustrated using FIG. 12 through FIG. 17.

Firstly, the way of supplying process gas from the process gas supply piping line 102 is explained. In order to supply highly pure process gases to the process apparatus, substitution of process gas for residual purge gas (e.g. Ar) in the supplying pipelines is carried out. Just before that, in the state as shown in FIG. 11, regulate the flow rate of purge gas (e.g. Ar) supplied from the process gas supply piping lines 102, 103, and 104 by means of needle valves 169, 174, and supply the gas to the reaction chamber of the process apparatus, so that the entire gas system is under purge.

Figure 12:
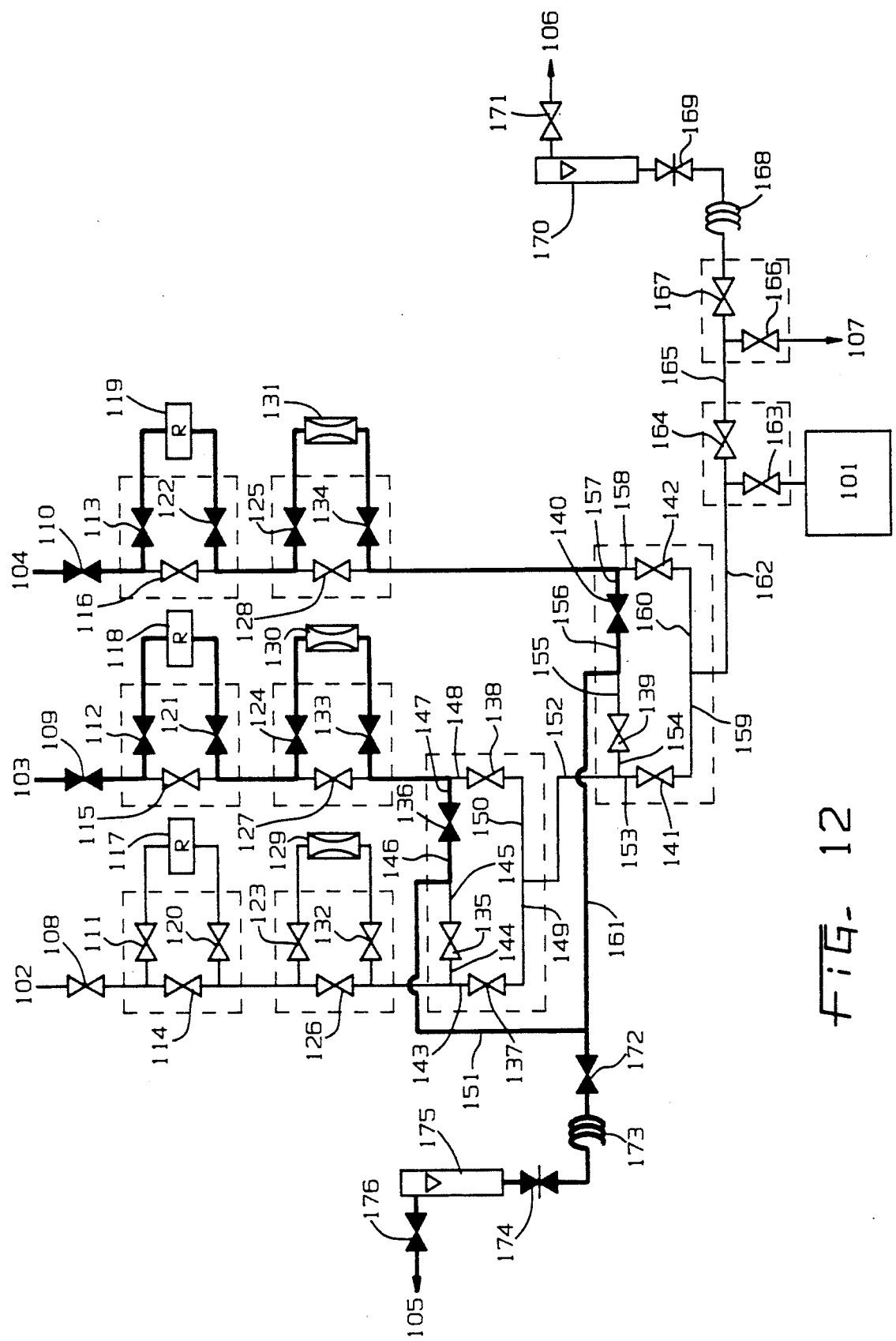
Figure 13:
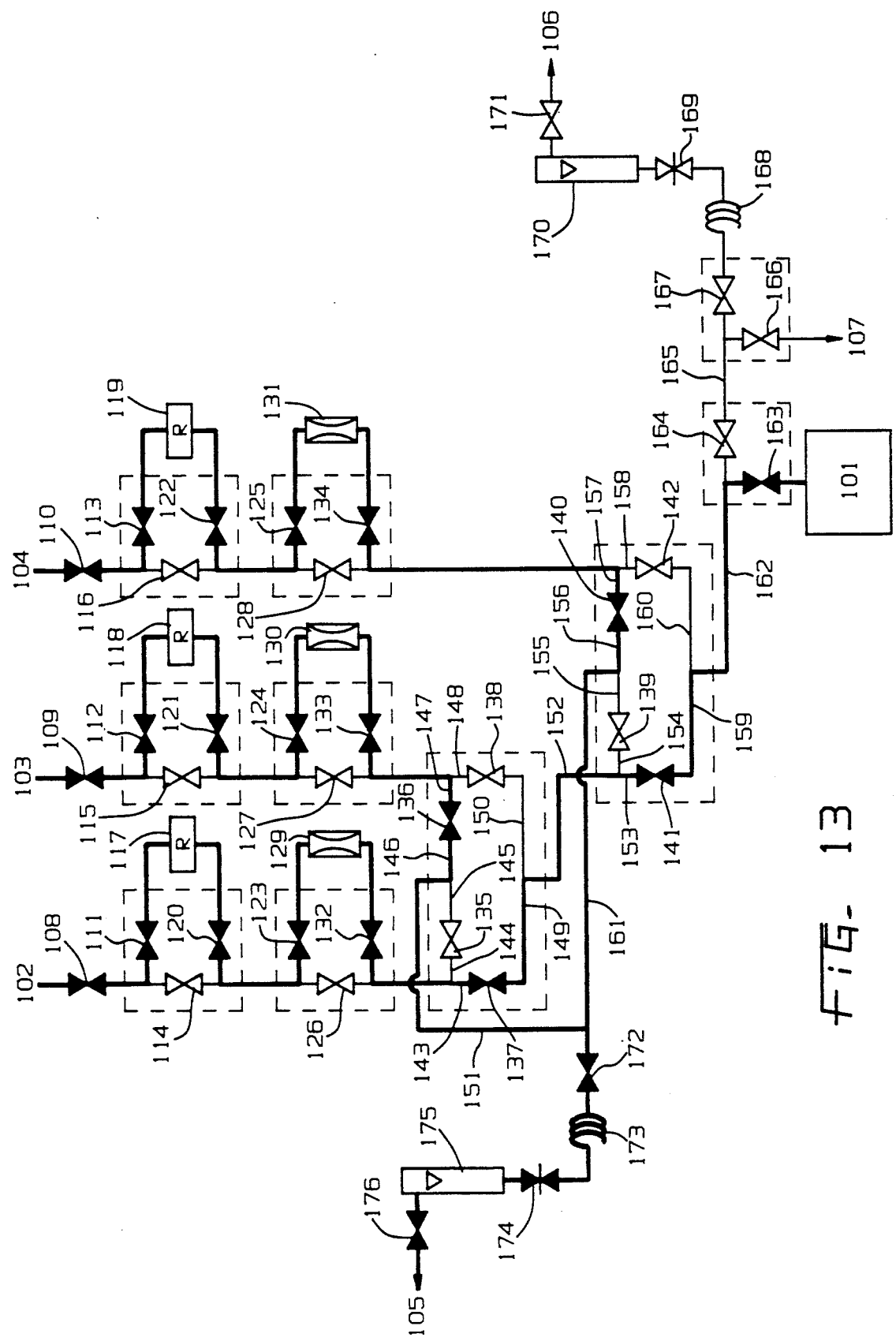

Subsequently, close valve 135, stop the supply of purge gas from process gas supply piping line 102, then close valves 171, 167, 172, and 176, stop the purging from purge gas exhaust pipelines 105, 106. Next, close valves 138, 139, 142, open valves 136, 140, 172, 176, start again the purging of process gas supply piping line systems 103, 104. At this time the flow of gas is as shown in FIG. 12. Then, open valves 114, 126, 137, 141, 164, 166, using vacuum exhaust pipeline 107 to proceed with the vacuum exhaust discharge of the process gas supply piping line 102 and the piping lines of the process apparatus. After the degree of vacuum in the piping lines has reached, say, $1 \times 10^{-2}$ Torr, close valve 166, supply process gas from the process gas supply piping line 102 to fill the piping system with process gas. After the piping system is filled with process gas, stop the supply of process gas, and proceed with the vacuum exhaust discharge in the piping system in the same way as the vacuum exhaust discharge the of purge gas. This supplying of process gas from the process gas supply piping line 102 and the vacuum exhaust discharge of the piping lines is usually repeated over 5 times. After thorough substitution of purge gas and process gas in the piping system has taken place, in the state wherein valves 114, 126, 164, 166 are closed, and valves 108, 111, 120, 123, 132, 137, 141, 163 are open, by using pressure regulator and mass controller 129, regulate the supply pressure and the flow rate of the process gas, and supply process gas to the reaction chamber 101 of the apparatus. The flow of gas at this time is as shown in FIG. 13.

Figure 14:
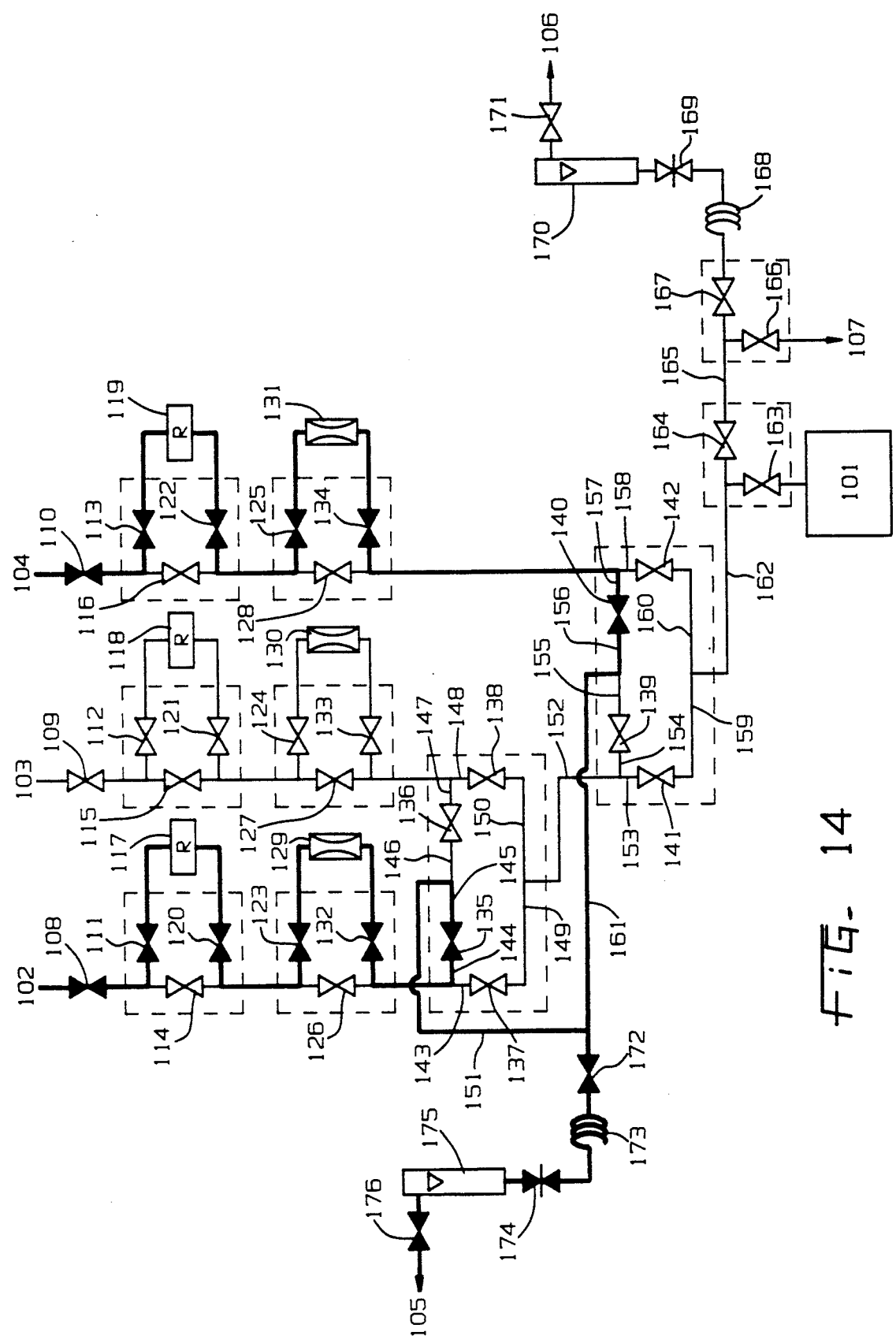
Figure 15:
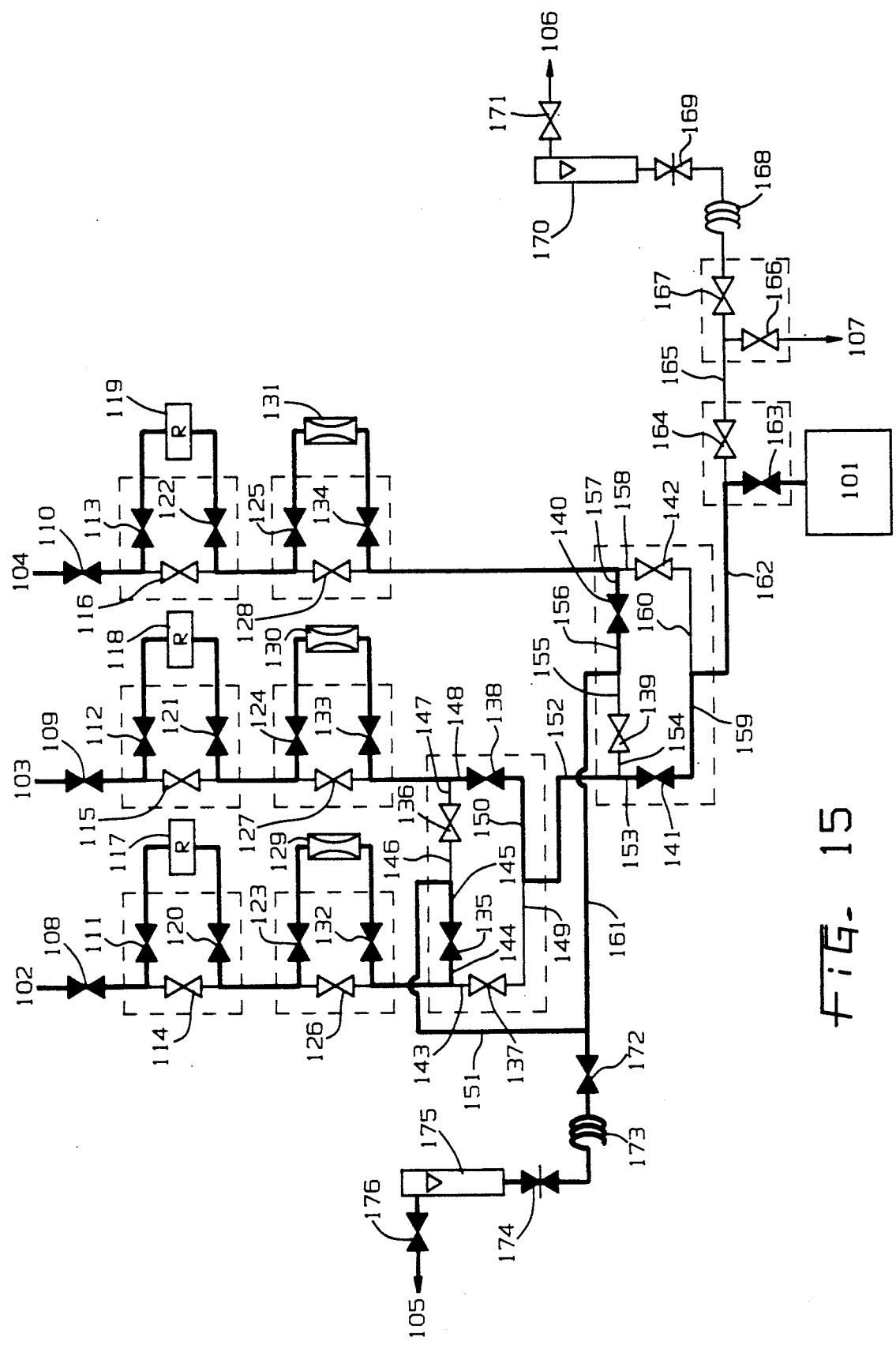

Following, in respect to the way of supplying gas from the process gas supply piping line 103, an illustration is given. In order to supply highly pure process gas to the process apparatus, similar to the method of supplying gas as mentioned above, the operation of substituting process gas for residual purge gas (e.g. Ar) in the supplying pipelines is being carried out. Just before that, in the state as shown in FIG. 11, regulate the flow rate of purge gas (e.g. Ar) supplied from the process gas supply piping lines 102, 103, and 104 by means of needle valves 169, 174, and supply the gas to the reaction chamber of the process apparatus, so that the entire gas system is under purge. Close valve 139, stop the supply of purge gas from process gas supply piping line 103, then close valves 171, 167, 172, and 176, stop the purging from the purge gas exhaust pipelines 105, 106. Next, close valves 138, 142, open valves 140, 172, 176, start again the purging of the process gas supply piping line systems 102, 104. At this time the flow of gas is as shown in FIG. 14. Then, open valves 115, 127, 138, 141, 164, 166, use vacuum exhaust pipeline 107 to proceed with the vacuum exhaust discharge of the process gas supply piping line 103 and the piping lines of the process apparatus. After the degree of vacuum in the piping lines has reached, say, $1 \times 10^{-2}$ Torr, close valve 166, supply process gas from process gas supply piping line 103 to fill the piping system with process gas. After the piping system is filled with process gas, stop the supply of process gas, and proceed with the vacuum exhaust discharge in the piping system in the same way as the vacuum exhaust discharge of purge gas. This supplying of process gas from the process gas supply piping line 103 and the vacuum exhaust discharge of the piping lines are usually repeated over 5 times. After thorough substitution of purge gas and process gas in the piping system has taken place, in the state wherein valves 115, 127, 164, 166 are closed, and valves 109, 112, 121, 124, 133, 138, 141, 163 are open, by using pressure regulator 118, and mass flow controller 130, regulate the supply pressure and the flow rate of the process gas, and supply the process gas to the reaction chamber 101 of the process apparatus. The flow of gas at this time is as shown in FIG. 15.

Figure 16:
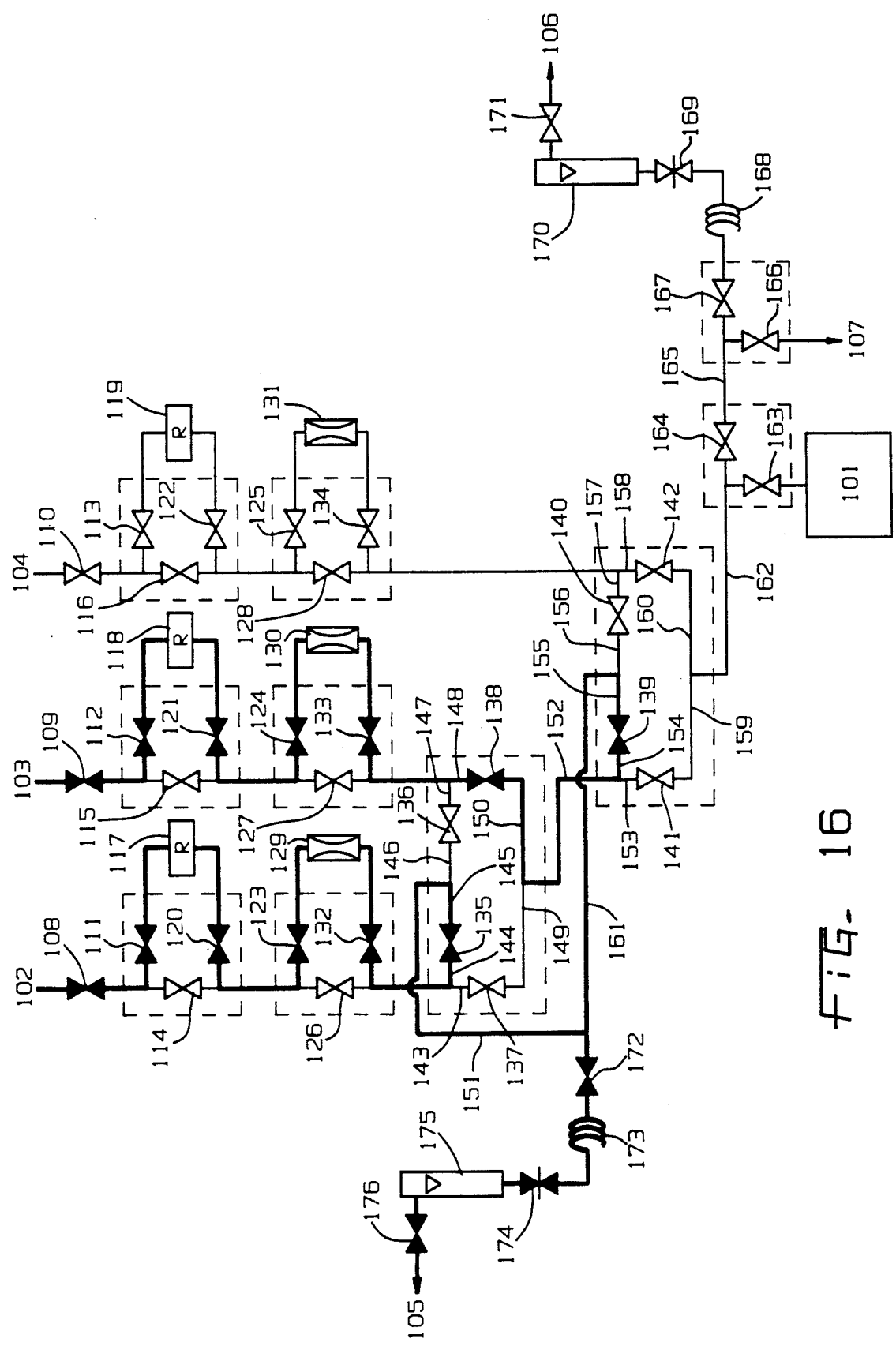
Figure 17:
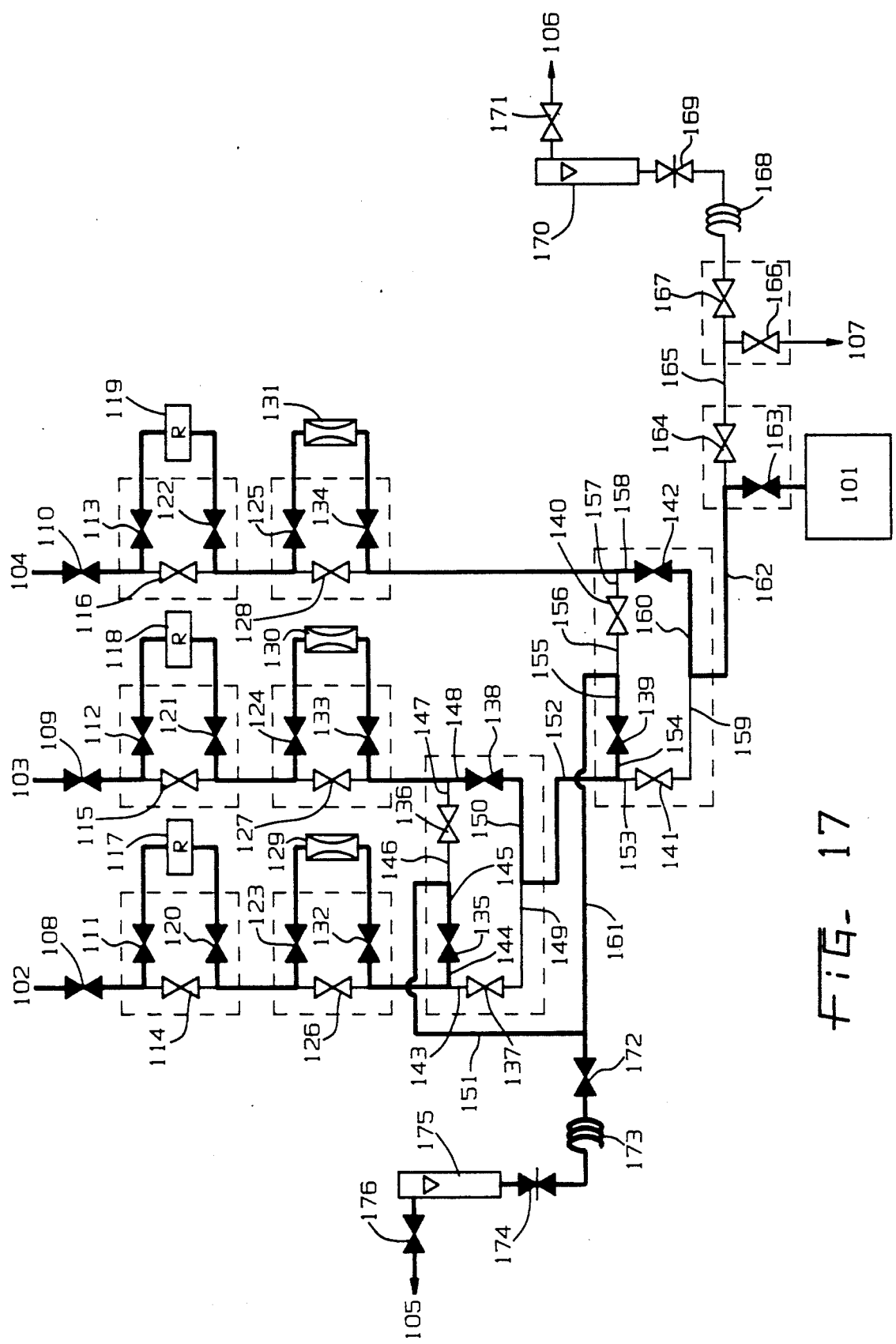

Following, in respect to the way of supplying gas from the process gas supply piping line 104, an illustration is given. In order to supply highly pure process gases to the process apparatus, similar to the method of supplying gas as mentioned above, the operation of substituting process gas for residual purge gas (e.g. Ar) in the supply pipelines is being carried out. Just before that, in the state as shown in FIG. 11, regulate the flow rate of purge gas (e.g. Ar) supplied from the process gas supply piping lines 102, 103, and 104 by means of needle valves 169, 174, and supply the gas to the reaction chamber of the process apparatus, so that the entire gas system is under purge. Close valves 171, stop the supply of purge gas the from the process gas supply piping line 104, then close valves 167, 172, 176, stop the purging from purge gas exhaust pipelines 105, 106. At this time the flow of gas is as shown in FIG. 16. Then, open valves 116, 128, 166, use vacuum exhaust pipeline 107 to proceed with the vacuum exhaust discharge of the process gas supply piping line 104 and the piping lines of the process apparatus. After the degree of vacuum in the piping lines has reached, say, $1 \times 10^{-2}$ Torr, close valve 166, supply process gas from the process gas supply piping line 104 to fill the piping system with process gas. After the piping system is filled with process gas, stop the supply of process gas, and proceed with the vacuum exhaust discharge in the piping system in the same way as the vacuum exhaust discharge of purge gas. This supplying of process gas from the process gas supply piping line 104 and the vacuum exhaust discharge of the piping lines are usually repeated over 5 times. After thorough substitution of purge gas and process gas in the piping system has taken place, in the state wherein valves 116, 128, 164, 166 are closed, and valves 110, 113, 122, 125, 134, 142, 163 are open, by using pressure regulator 119, and mass flow controller 131, regulate the supply pressure and the flow rate of the process gas, and supply the process gas to the reaction chamber 101 of the process apparatus. The flow of gas at this time is as shown in FIG. 17.

Following, reference is made to FIG. 18 through FIG. 23 to illustrate the operation of supplying simultaneously two process gases.

Figure 18:
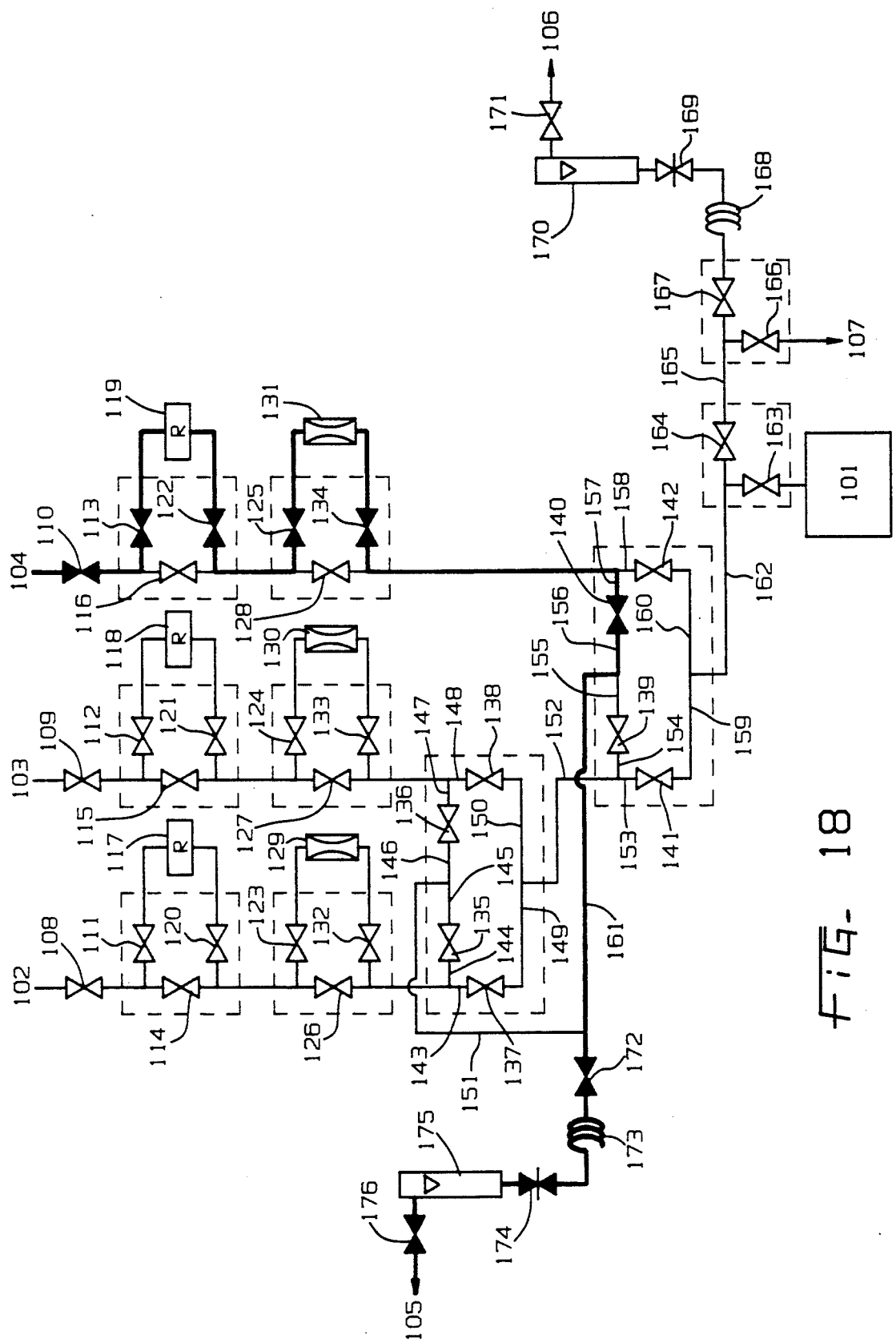
Figure 19:
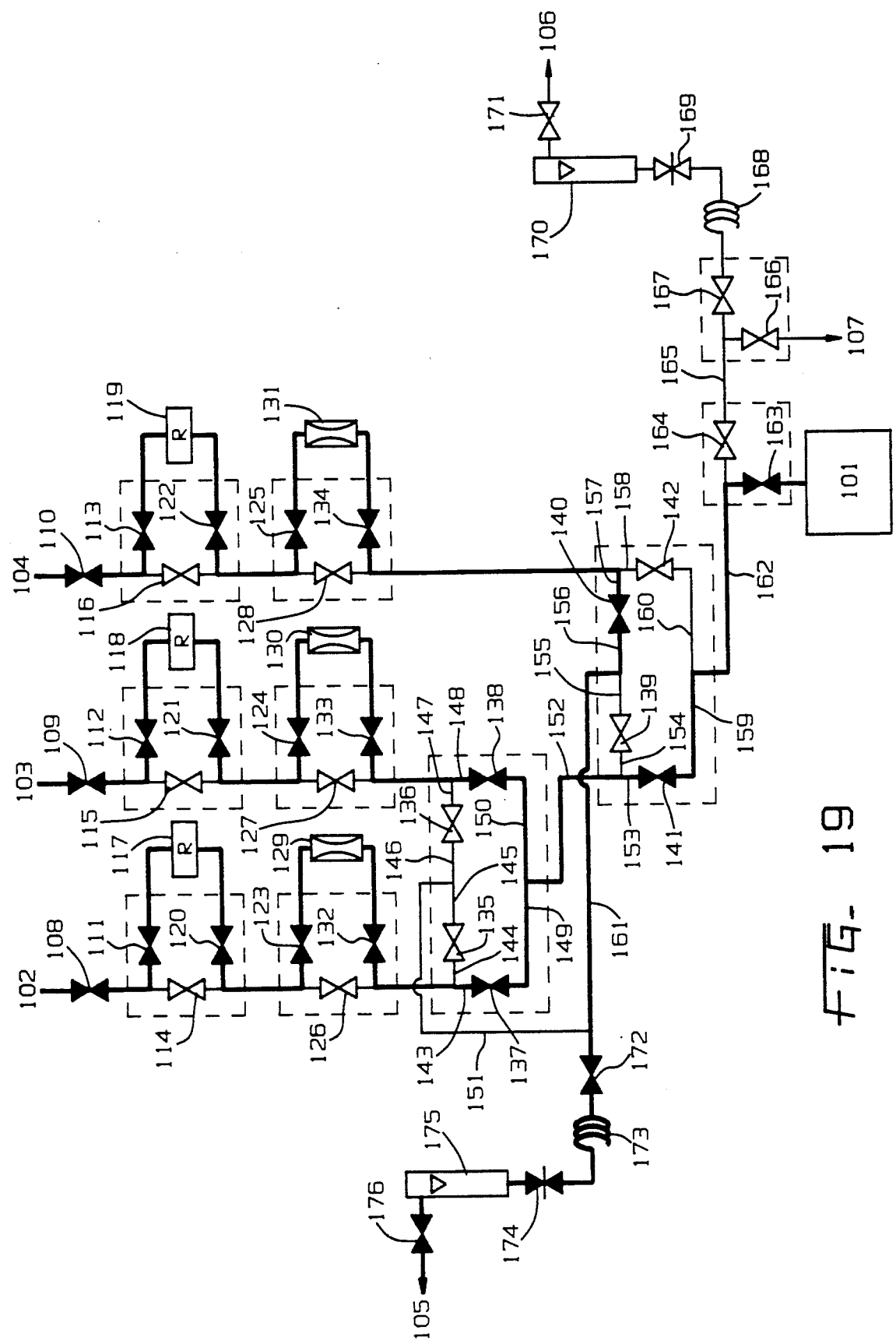

First of all, the process of supplying process gas from process gas supply pipelines 102, 103 to the reaction chamber 101 of the process apparatus will be illustrated. Similar to the way of supplying one kind of process gas mentioned above, in order to supply highly pure process gases to the process apparatus, the operation of substituting process gas for residual purge gas (e.g. Ar) in the supplying pipelines is being carried out. Just before that, in the state as shown in FIG. 11, regulate the flow rate of purge gas (e.g. Ar) supplied from the process gas supply piping lines 102, 103, and 104 by means of needle valves 169, 174, and supply the gas to the reaction chamber of the process apparatus, so that the entire gas system is under purge. Close valves 176, stop the supply of purge gas from the process gas supply piping lines 102, 103, then close valves 171, 167, 172, stop the purging from purge gas exhaust pipelines 105, 106. Next, close valves 135, 139, 142, open valves 140, 172, 176, start again the purging of the process gas supply piping line system 104. At this time the flow of gas is as shown in FIG. 18. Then, open valves 114, 115, 126, 127, 137, 141, 166, use vacuum exhaust pipeline 107 to proceed with the vacuum exhaust discharge of the process gas supply piping lines 102, 103 and the piping lines of the process apparatus. After the degree of vacuum in the piping lines has reached, say, $1 \times 10^{-2}$ Torr, close valve 166, 138 (or 137), supply process gas from the process gas supply piping lines 102, 103 to fill the piping system with process gas. After the piping system is filled with process gas, stop the supply of process gas, and proceed with the vacuum exhaust discharge in the piping system in the same way as the vacuum exhaust discharge of purge gas. This supplying of process gas from the process gas supply piping lines 102, 103 and the vacuum exhaust discharge of the piping lines are usually repeated over 5 times. After thorough substitution of purge gas and process gas in the piping system has taken place, in the state wherein valves 114, 115, 126, 127, 164, 166 are closed, and valves 108, 109, 111, 112, 120, 121, 123, 124, 132, 133, 137, 138, 141, 163 are open, by using pressure regulators 117, 118, and mass flow controllers 129, 130, regulate the supply pressure and the flow rate of the process gas, and supply process gas to the reaction chamber 101 of the process apparatus. The flow of gas at this time is as shown in FIG. 19.

Figure 20:
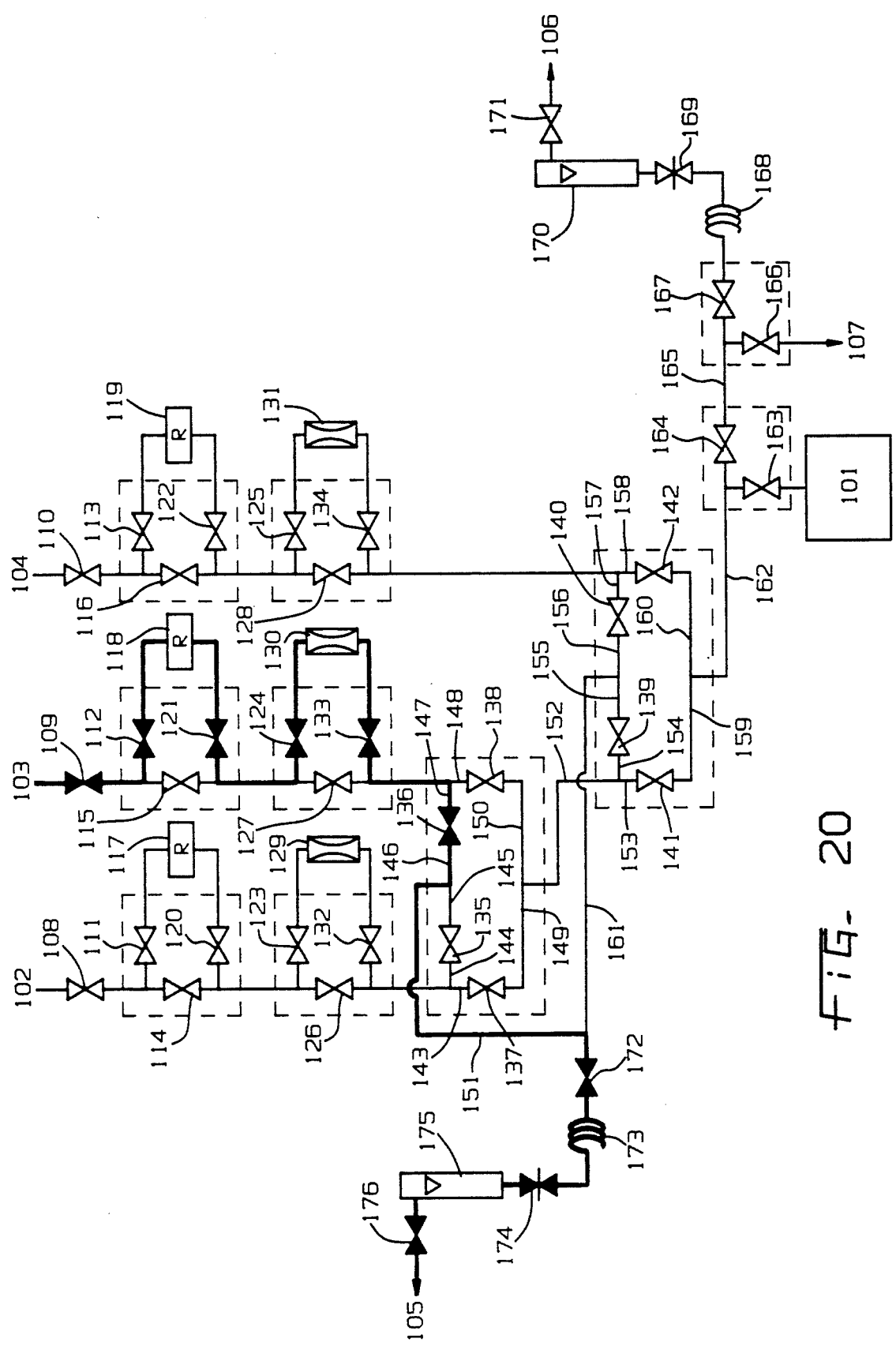
Figure 21:
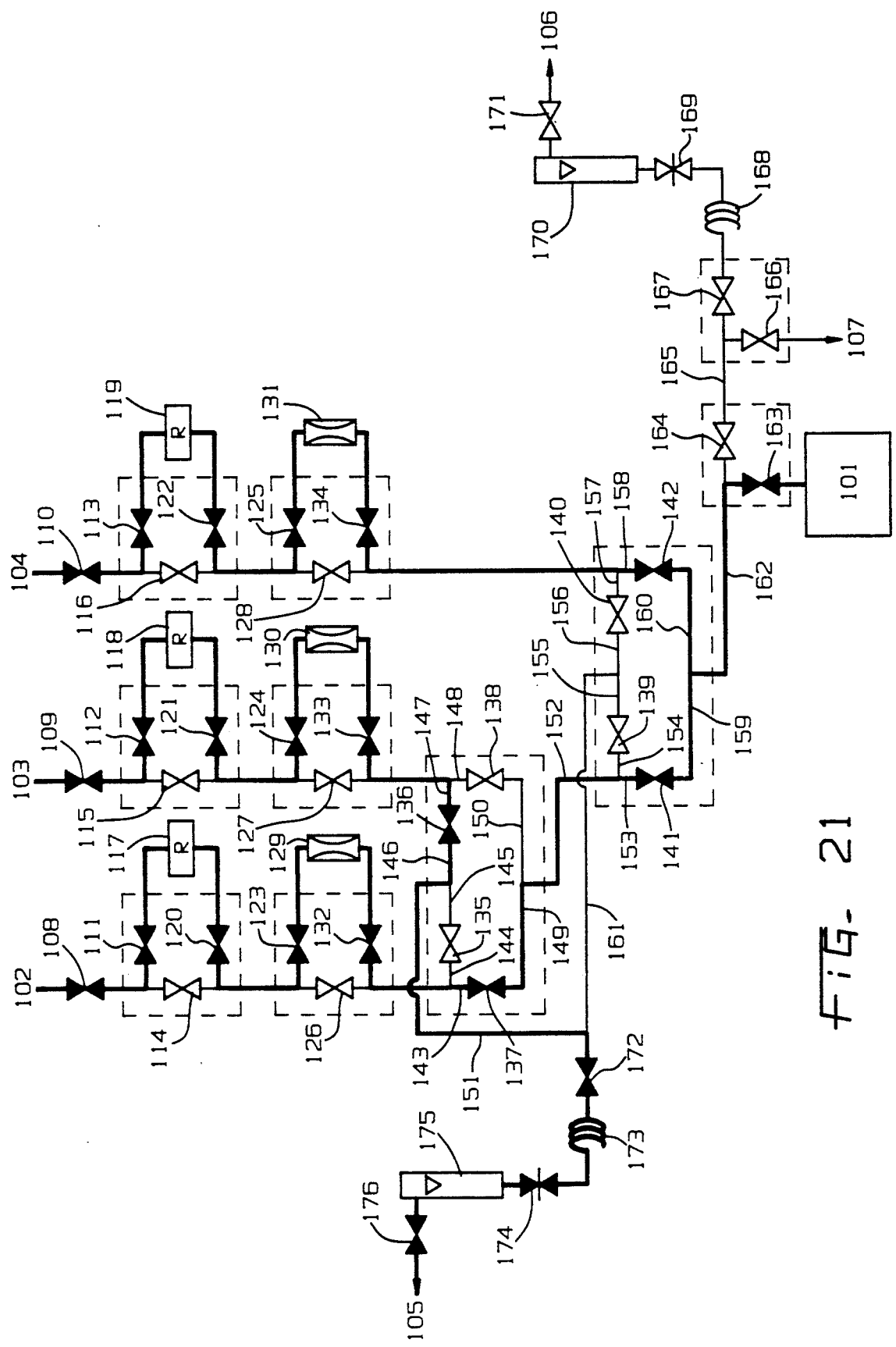

Following, the way of supplying simultaneously process gas supplied from the process gas supply lines 102, 104 to the reaction chamber is illustrated. In order to supply highly pure process gas to the process apparatus, the operation of substituting process gas for residual purge gas (e.g. Ar) in the supply pipelines is being carried out. Just before that, in the state as shown in FIG. 11, regulate the flow rate of purge gas (e.g. Ar) supplied from the process gas supply piping lines 102, 103, and 104 by means of needle valves 169, 176, and supply the gas to the reaction chamber of the process apparatus, so that the entire gas system is under purge. Close valves 135, 171, stop the supply of purge gas from the process gas supply piping lines 102, 104, then close valves 167, 172, 176, stop the purging from purge gas exhaust pipelines 105, 106. Next, close valves 138, 139, open valves 136, 172, 176, start again the purging of the process gas supply piping line system 103. At this time the flow of gas is as shown in FIG. 20. Then, open valves 114, 116, 126, 128, 137, 141, 166, use vacuum exhaust pipeline 107 to proceed with the vacuum exhaust discharge of the process gas supply piping lines 102, 104 and the piping lines of the process apparatus. After the degree of vacuum in the piping lines has reached, say $1 \times 10^{-2}$ Torr, close valve 166, 142 (141 can also do), supply process gas from the process gas supply piping lines 102, 104 to fill the piping system with process gas. After the piping system is filled with process gas, stop the supply of process gas, and proceed with the vacuum exhaust discharge in the piping system in the same way as the vacuum exhaust discharge of purge gas. This supplying of process gas from the process gas supply piping lines 102, 104 and the vacuum exhaust discharge of the piping lines are usually repeated over 5 times. After thorough substitution of purge gas and process gas in the piping system has taken place, in the state wherein valves 114, 116, 126, 128, 164, 166 are close, and valves 108, 110, 111, 113, 120, 122, 123, 125, 132, 134, 137, 141, 142, 163 are open, by using pressure regulators 117, 119, and mass flow controllers 129, 131, regulate the supply pressure and the flow rate of the process gas, and supply the process gas to the reaction chamber 101 of the process apparatus. The flow of gas at this time is as shown in FIG. 21.

Figure 22:
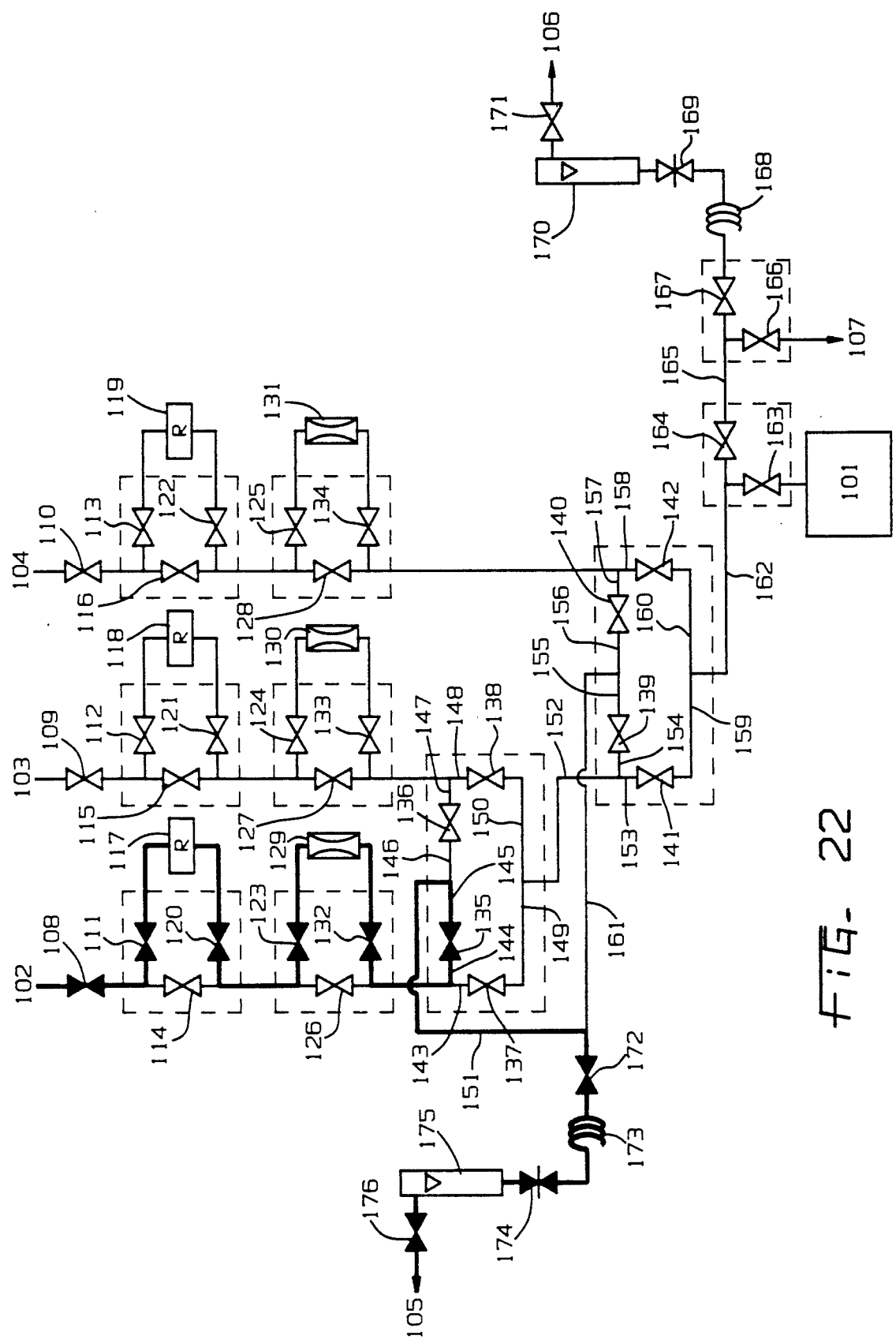
Figure 23:
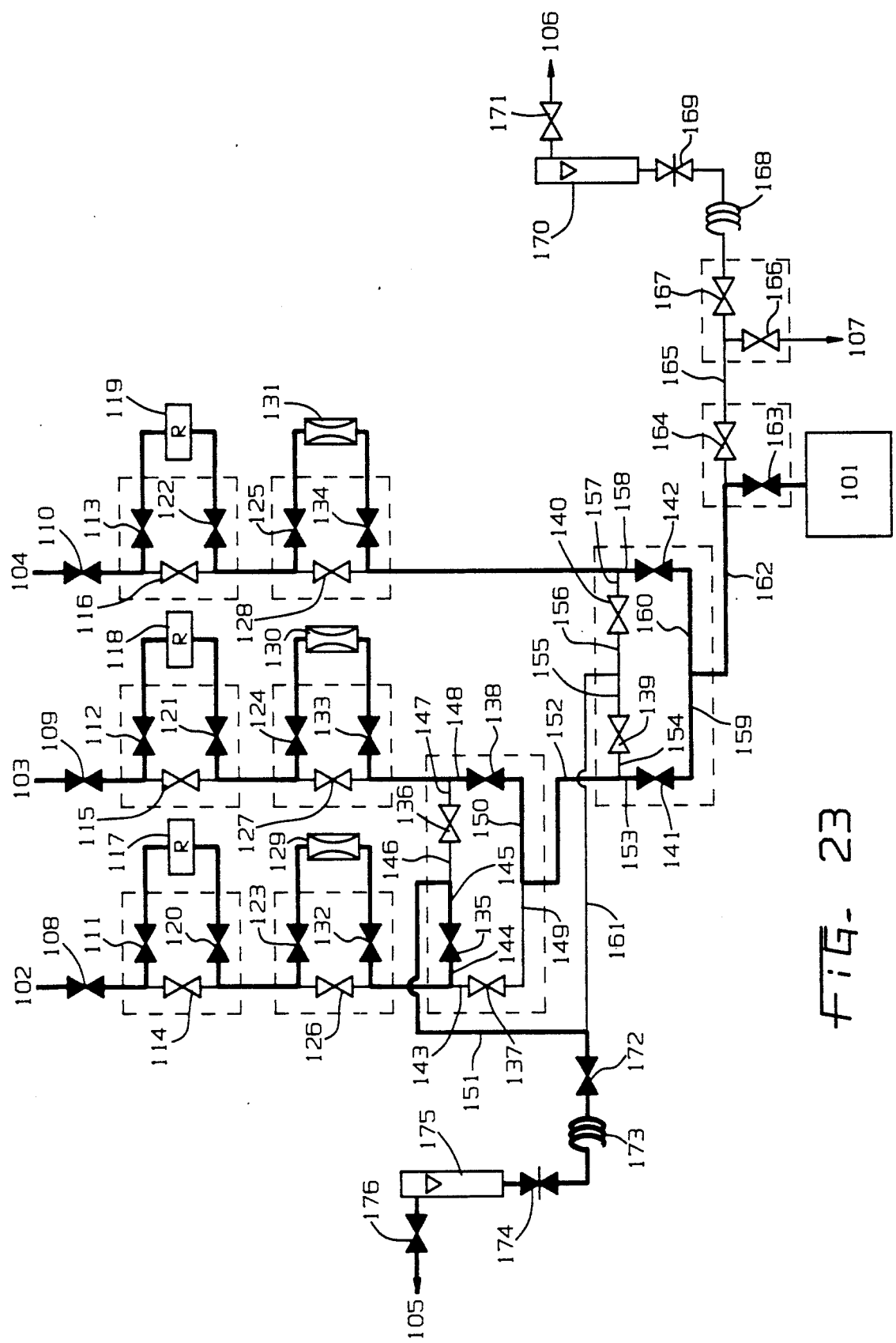

Following, the way of supplying simultaneously process gas supplied from the process gas supply piping lines 103, 104 to the reaction chamber 101 of the process apparatus is illustrated. In order to supply highly pure process gases to the process apparatus, the operation of substituting process gas for residual purge gas (e.g. Ar) in the supply pipelines is being carried out. Just before that, in the state as shown in FIG. 11, regulate the flow rate of purge gas (e.g. Ar) supplied from the process gas supply piping lines 102, 103, and 104 by means of needle valves 169, 176, and supply the gas to the reaction chamber of the process apparatus, so that the entire gas system is under purge. Close valves 139, 167, 171, stop the supply of purge gas from the process gas supply piping lines 103, 104, stop the purging from purge gas exhaust pipelines 106. The flow of gas at this time is as shown in FIG. 22. Then, open valves 115, 116, 127, 128, 141, 166, use vacuum exhaust pipeline 107 to proceed with the vacuum exhaust discharge of the process gas supply piping lines 103, 104 and the piping lines of the process apparatus. After the degree of vacuum in the piping lines has reached, say, $1 \times 10^{-2}$ Torr, close valve 166, 142 (141 can also do), supply process gas from the process gas supply piping lines 103, 104 to fill the piping system with process gas. After the piping system is filled with process gas, stop the supply of process gas, and proceed with the vacuum exhaust discharge in the piping system in the same way as the vacuum exhaust discharge of purge gas. This supplying of process gas from the process gas supply piping lines 103, 104 and the vacuum exhaust discharge of the piping lines are usually repeated over 5 times. After thorough substitution of purge gas and process gas in the piping system has taken place, in the state wherein valves 115, 116, 127, 128, 164, 166 are closed, and valves 109, 110, 112, 113, 121, 122, 124, 125, 133, 134, 138, 141, 142, 163 are open, by using pressure regulators 118, 119, and mass flow controllers 130, 131, regulate the supply pressure and the flow rate of the process gas, and supply the process gas to the reaction chamber 101 of the process apparatus. The flow of gas at this time is as shown in FIG. 23.

The above is a description of the method of supplying one or two kinds of process gas. As for 3 kinds of process gas, they can also be supplied. Furthermore, when supplying process gas as mentioned above, the individual process gas supply piping line of the process apparatus, except during the opening or closing of directional control valves in the purge gas piping lines, will have no residence of gas.

Stopping the supply of process gas

Next, the method of stopping the supply of process gas is illustrated with reference to FIG. 24 through FIG. 28. The operation is similar to that of supplying process gas, only that this is not substituting purge gas with process gas, but substituting process gas with purge gas.

Figure 24:
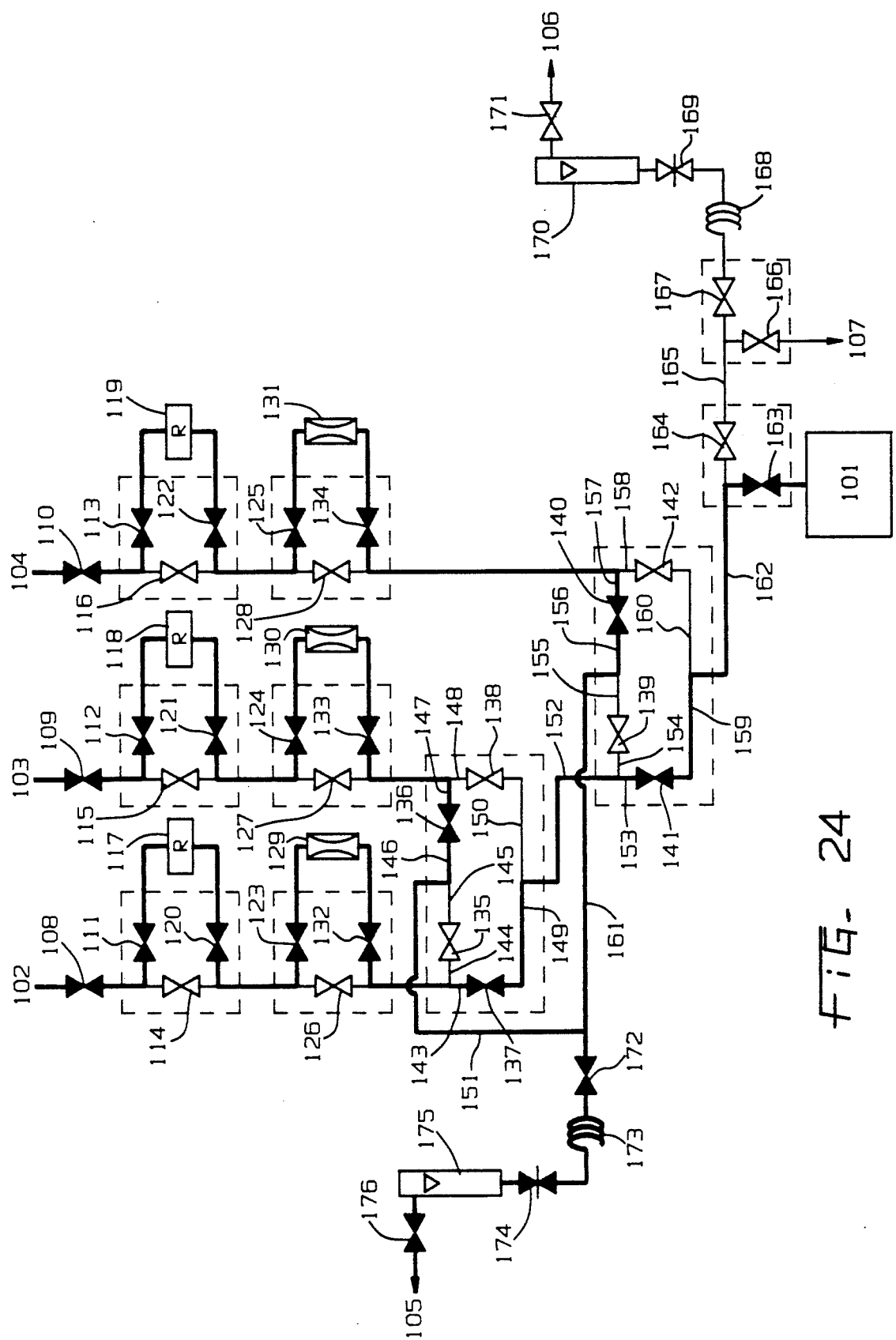
Figure 25:
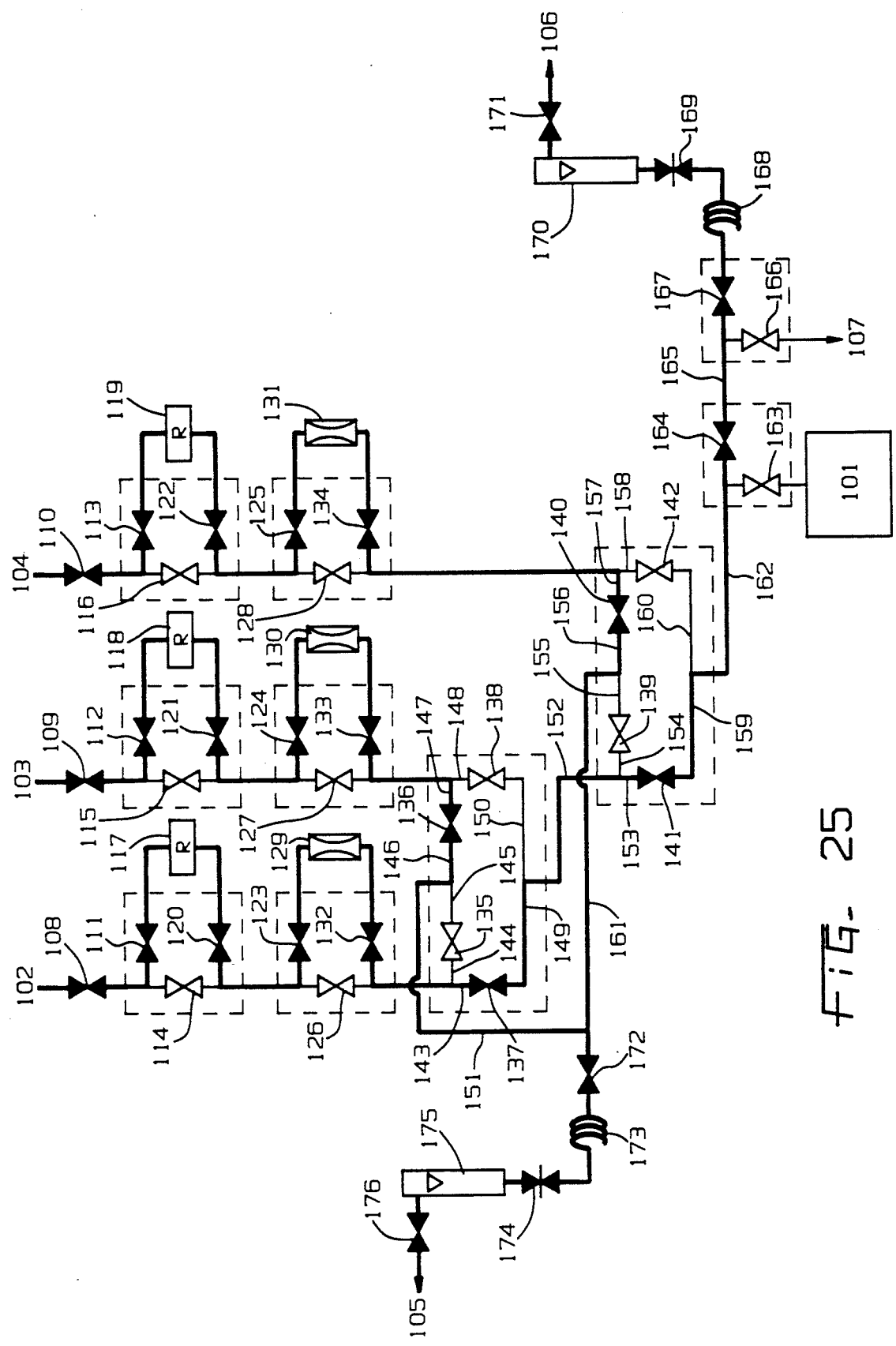

First of all, in respect to the method of stopping the use of process gas supplied from the process gas supply piping line 102, an explanation is given. The gas system is in the state wherein valves 108, 109, 110, 111, 112, 113, 120, 121, 122, 123, 124, 125, 132, 133, 134, 136, 137, 140, 141, 163, 172, and 176 are all open, 114, 115, 116, 126, 127, 128, 135, 138, 139, 142, 164, 166, 167 and 171 are all closed, and is supplied process gas from the process gas supply piping line 102 and purge gas (e.g. Ar, etc.) from 103, 104. The flow of the purge gas is regulated by the needle valve 174, and flows to purge gas exhaust pipeline 105, the supply pressure and the flow rate of process gas are regulated by means of the pressure regulator 117 and the mass flow controller 129, and flows to the reaction chamber 101 of the process apparatus. The flow of gas at this time is as shown in FIG. 24. First of all, close valve 163, stop the supply of process gas from the process gas supply pipeline 102, then open valves 164, 166, use vacuum exhaust pipeline 107 to carry out vacuum exhaust discharge of the process gas supply piping line 102 and piping lines of the process apparatus. After the degree of vacuum in the piping lines has reached, say, $1 \times 10^{-2}$ Torr, close valve 166, supply purge gas (e.g. Ar. etc.) from the process gas supply piping line 102 to fill the piping system with purge gas. After the piping system is filled with purge gas, stop the supply of purge gas, and proceed with the vacuum exhaust discharge in the piping system in the same way as the vacuum exhaust discharge of process gas. This supplying of purge gas from the process gas supply piping line 102 and the vacuum exhaust discharge of the piping lines are usually repeated over 5 times. After thorough substitution of purge gas and process gas in the piping system has taken place, close valve 166, supply purge gas from process gas supply piping line 102, open valves 167, 171, regulate the flow rate by means of needle valve 169, by introducing purge gas into purge gas exhaust pipeline 106, proceed with the purging in the system of the process gas supply piping line 102. By means of the above, purging in the unused system of the process gas supply piping lines 103, 104 will not be interrupted; therefore, the supply of process gas can be stopped and purging can be started again in the system of the process gas supply piping line 102. The flow of gas at this time is as shown in FIG. 25. Furthermore, the way of supplying process gas from the process gas supply piping lines 103, 104 can be carried out in the same way; by stopping the supply of process gas, there is no need to interrupt the purging of other unused gas system, the purge can be started again.

Figure 26:
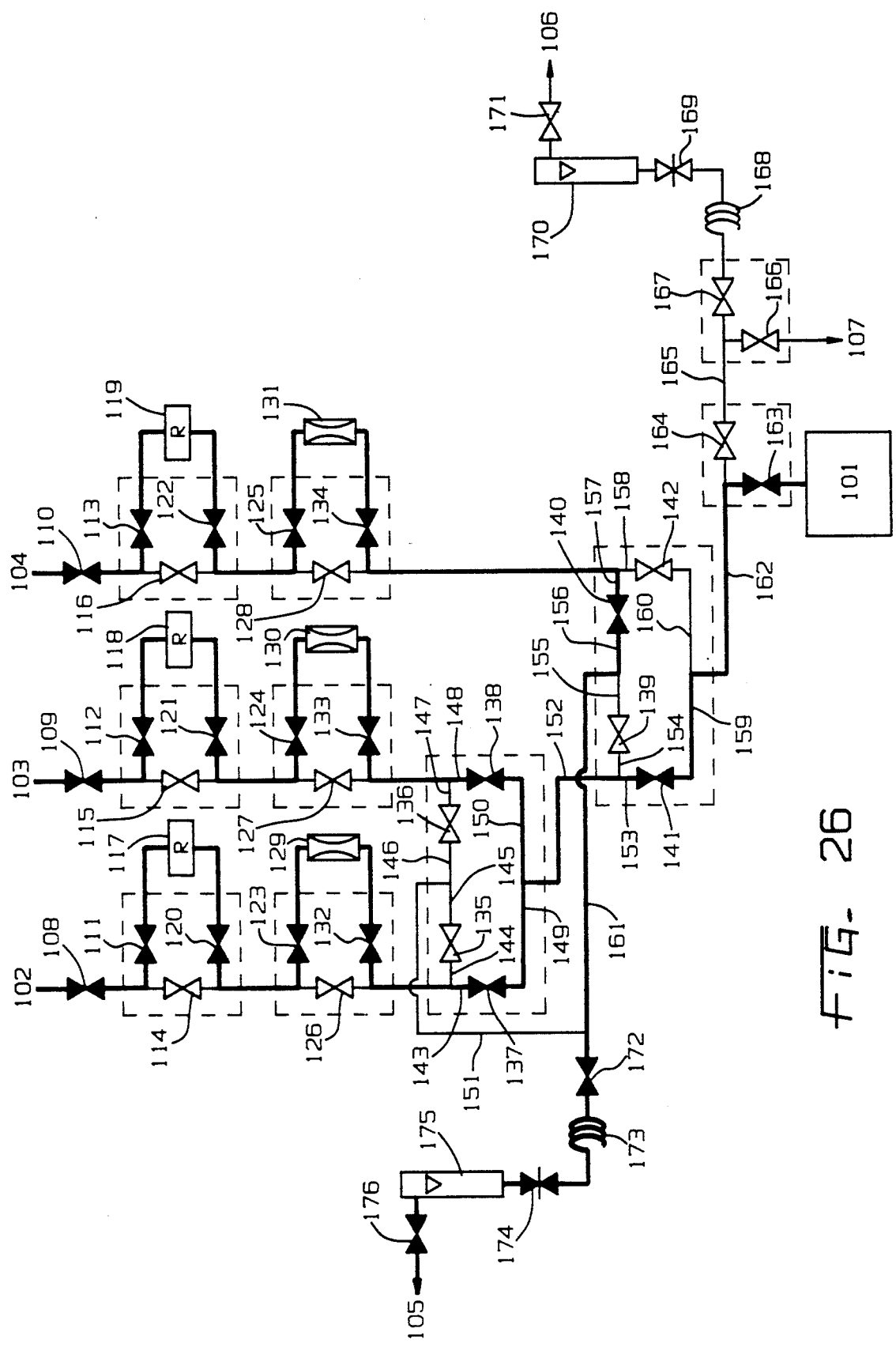
Figure 27:
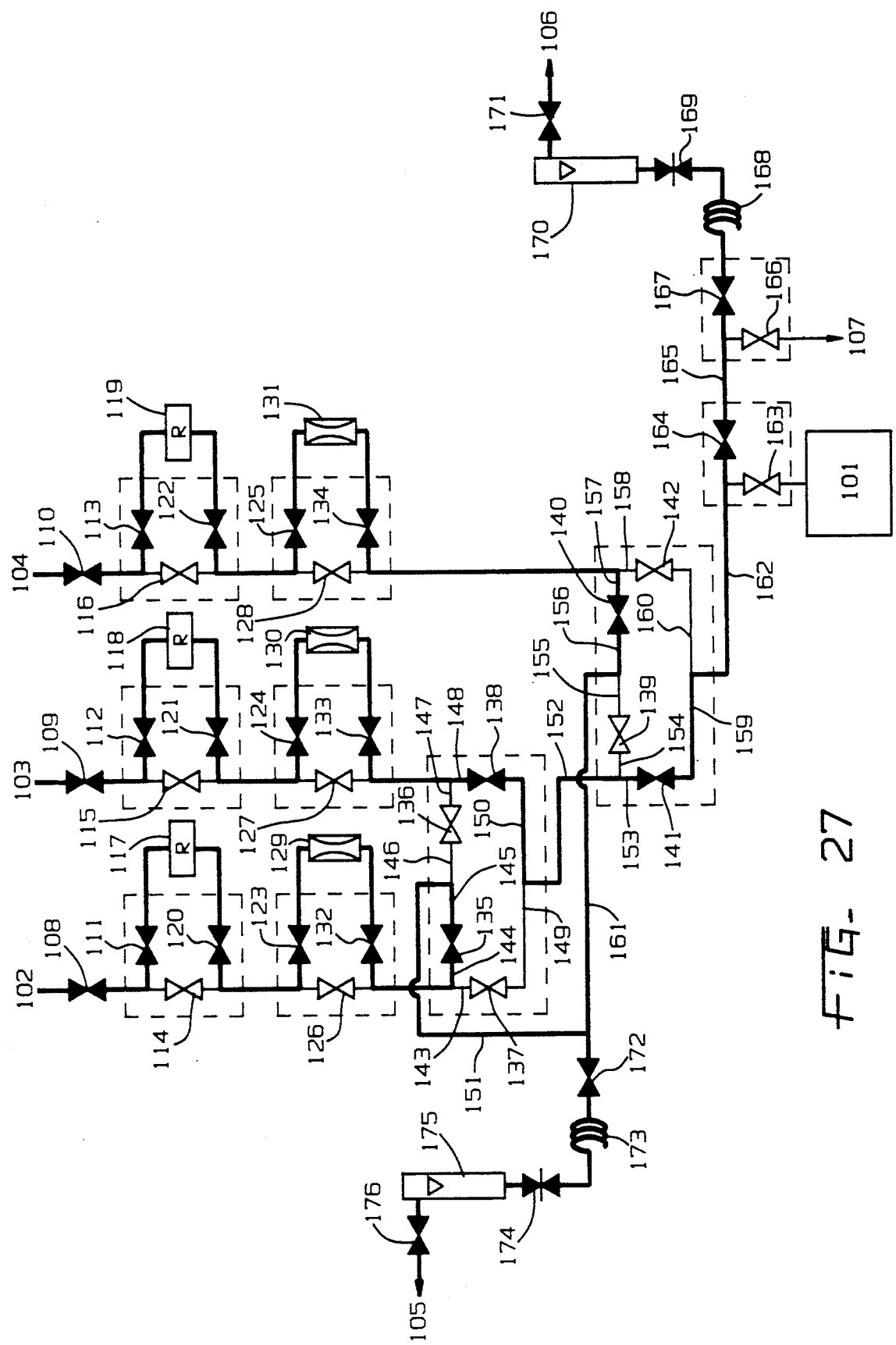
Figure 28:
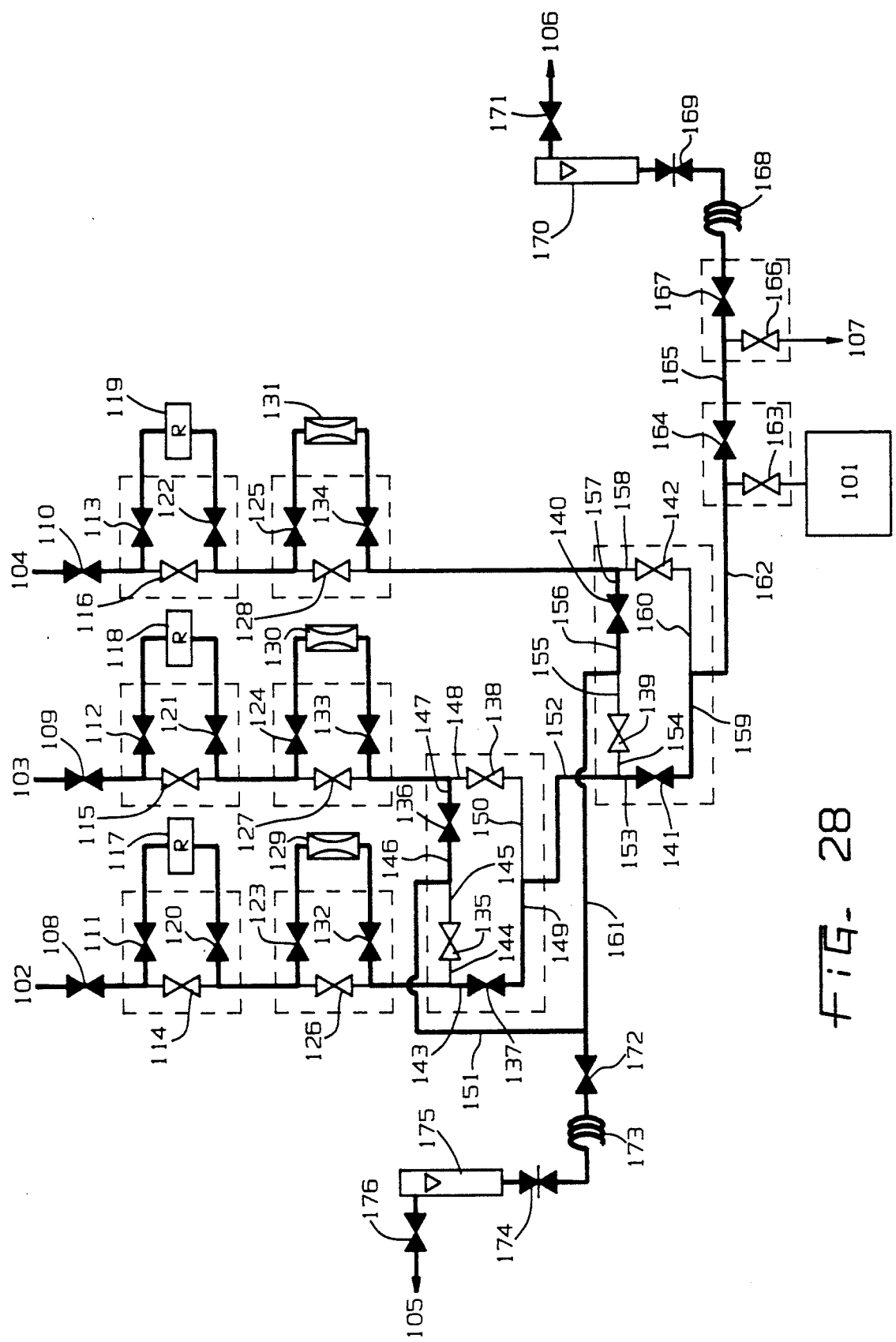

Subsequently, in respect to the method of stopping under the circumstance that two kinds of process gas are being simultaneously supplied, an explanation is given. The gas system is in the state wherein valves 108, 109, 110, 111, 112, 113, 120, 121, 122, 123, 124, 125, 132, 133, 134, 137, 138, 140, 141, 163, 172, and 176 are all open, 114, 115, 116, 126, 127, 128, 135, 136, 139, 142, 164, 166, 167 and 171 are all closed; supply process gas from the process gas supply piping lines 102, 103, supply purge gas (e.g. Ar) from 104, regulate the flow of purge gas by means of the needle valbe 174, and flows to the purge gas exhaust pipeline 105; and as for process gas; regulate the supply pressure and the flow rate by means of pressure regulators 117, 118, and mass flow controllers 129, 130, and flows to the reaction chamber 101 of the process apparatus. The flow of gas at this time is as shown in FIG. 26. First of all, close valve 163, stop the supply of process gas from the process gas supply pipelines 102, 103, then open valves 164, 166, use vacuum exhaust pipeline 107 to carry out vacuum exhaust discharge of the process gas supply piping lines 102, 103, and piping lines of the process apparatus. After the degree of vacuum in the piping lines has reached, say, $1 \times 10^{-2}$ Torr, close valve 166, supply purge gas (e.g. Ar, etc.) from process gas supply piping lines 102, 103 to fill the piping system with purge gas. After the piping system is filled with purge gas, stop the supply of purge gas, and proceed with the vacuum exhaust discharge in the piping system in the same way as the vacuum exhaust discharge of process gas. This supplying of purge gas from the process gas supply piping lines 102, 103, and the vacuum exhaust discharge of the piping lines are usually repeated over 5 times. After thorough substitution of purge gas and process gas in the piping system has taken place, close valve 166, supply purge gas from the process gas supply piping lines 102, 103, close valves 136, 137, open valves 135, 167, 171, regualte the flow rate by means of needle valves 169, 174, by introducing purge gas into the purge gas exhaust pipelines 105, 106, proceed with the purging in the systems of the process gas supply piping lines 102, 103. By means of the above, without the interruption of the purging in the process gas supply piping line 104, the supply of process gas can be stopped and purging can be started again in the systems of the process gas supply piping lines 102, 103. The flow of gas at this time is as shown in FIG. 27. Further, when purging restarts, close valves 135, 138; valves 136, 167, 171 can also be opened. The flow of gas at this time is as shown in FIG. 28. Similarly, in the process gas supply piping lines 102 and 104, 103 and 104, under the condition that 3 kinds of process gas are simultaneously supplied, stopping the supply of process gas, purging can recommence without the need to interrupt the purging in other unused systems.

Second and third embodiments

Figure 29:
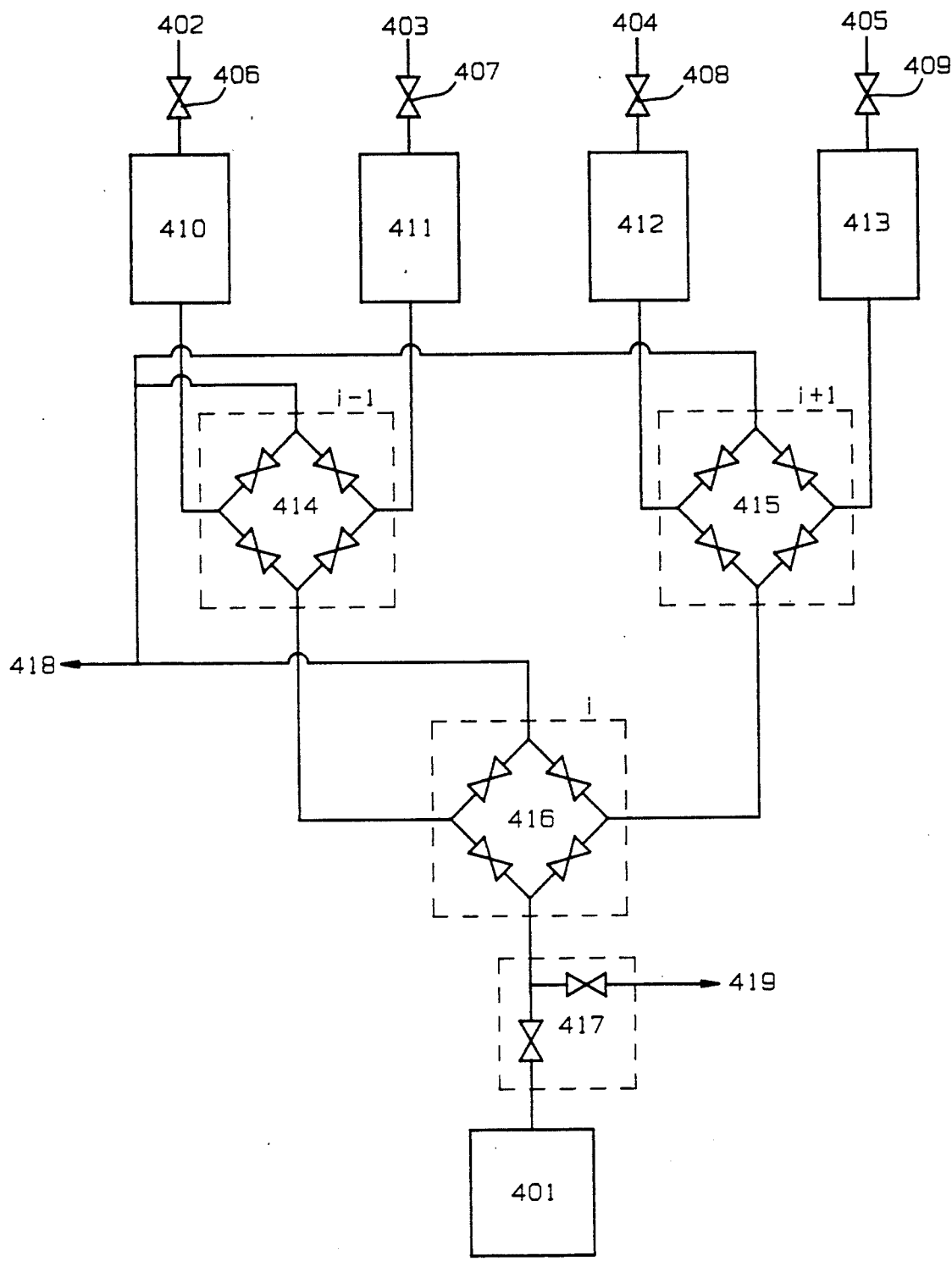
FIG. 29 is a fragmentary block diagram showing the second preferred embodiment.
Figure 30:
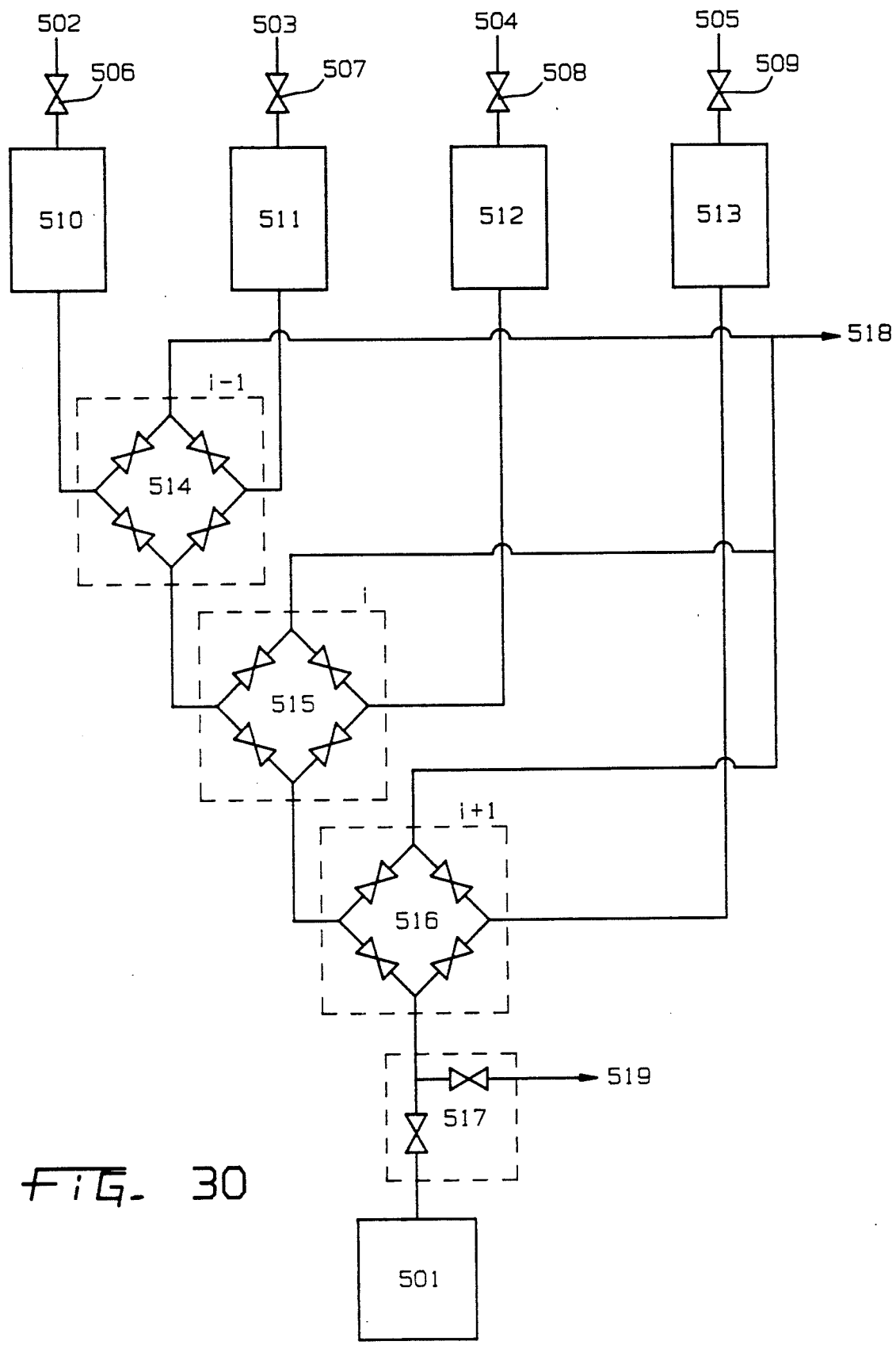
FIG. 30 is a fragmentary block diagram showing the third preferred embodiment.
Figure 31A:
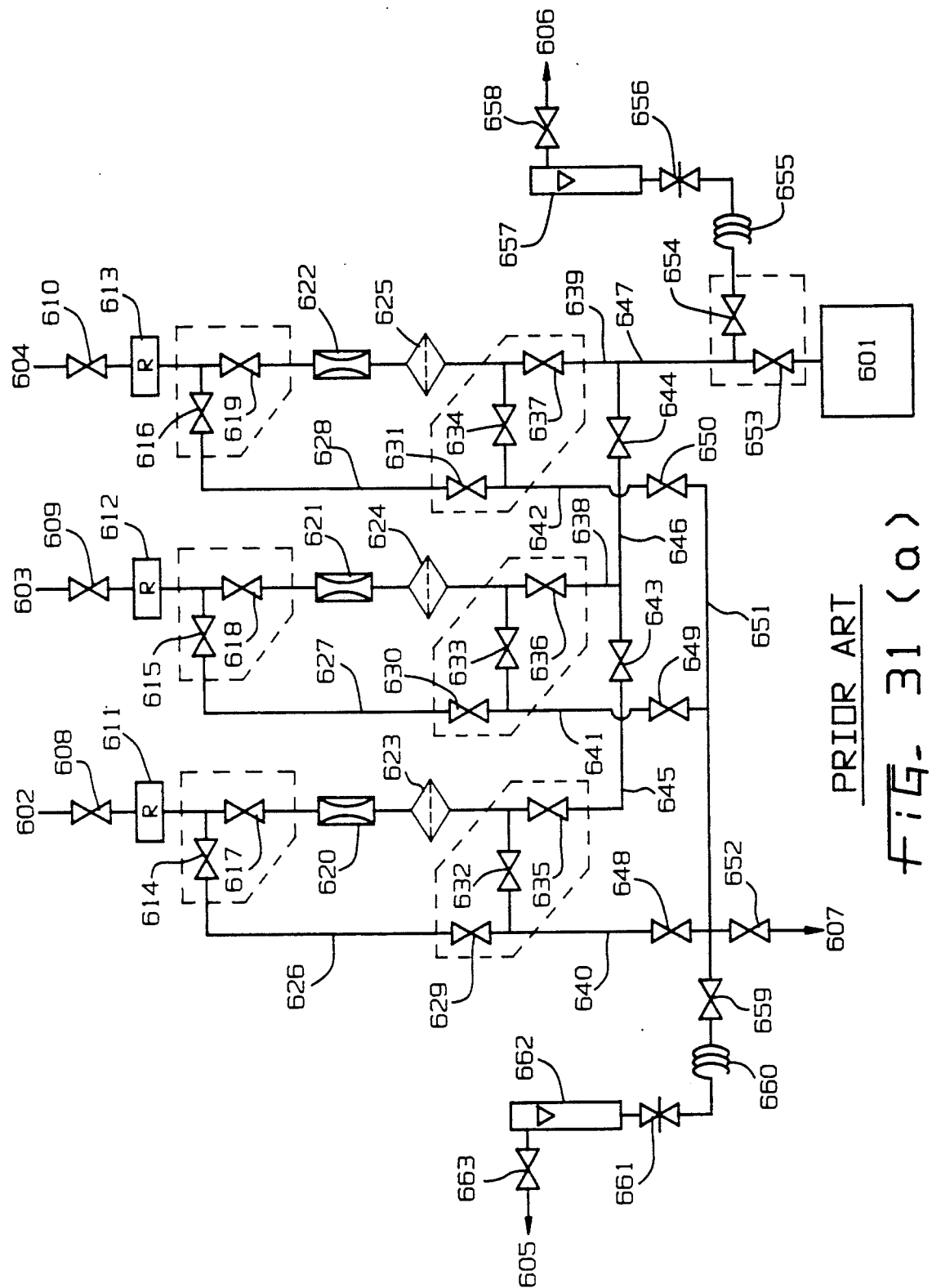
FIG. 31(a) through (g) are block diagrams showing the gas supply piping device of a process apparatus used in the past.
Figure 31B:
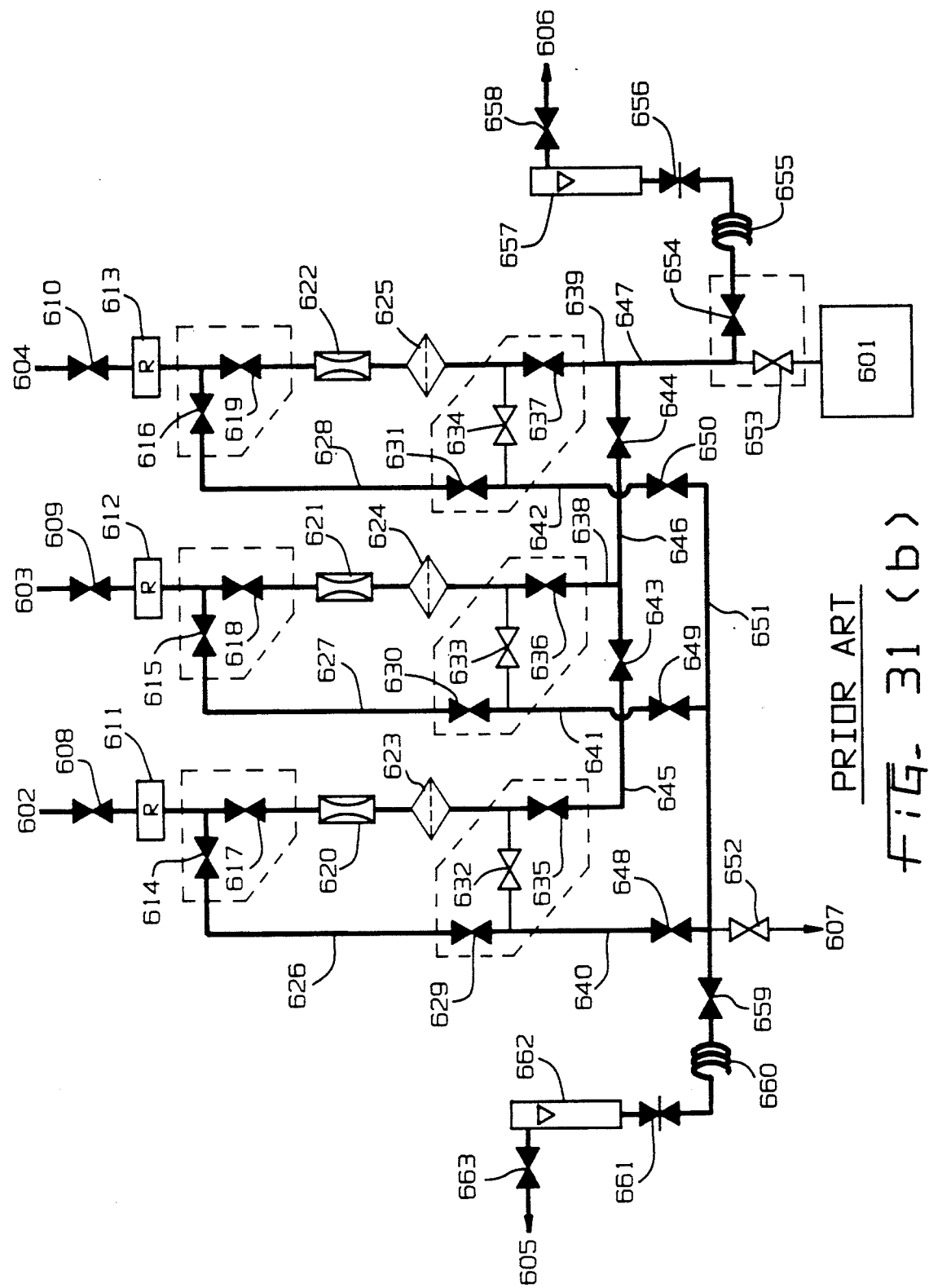
Figure 31C:
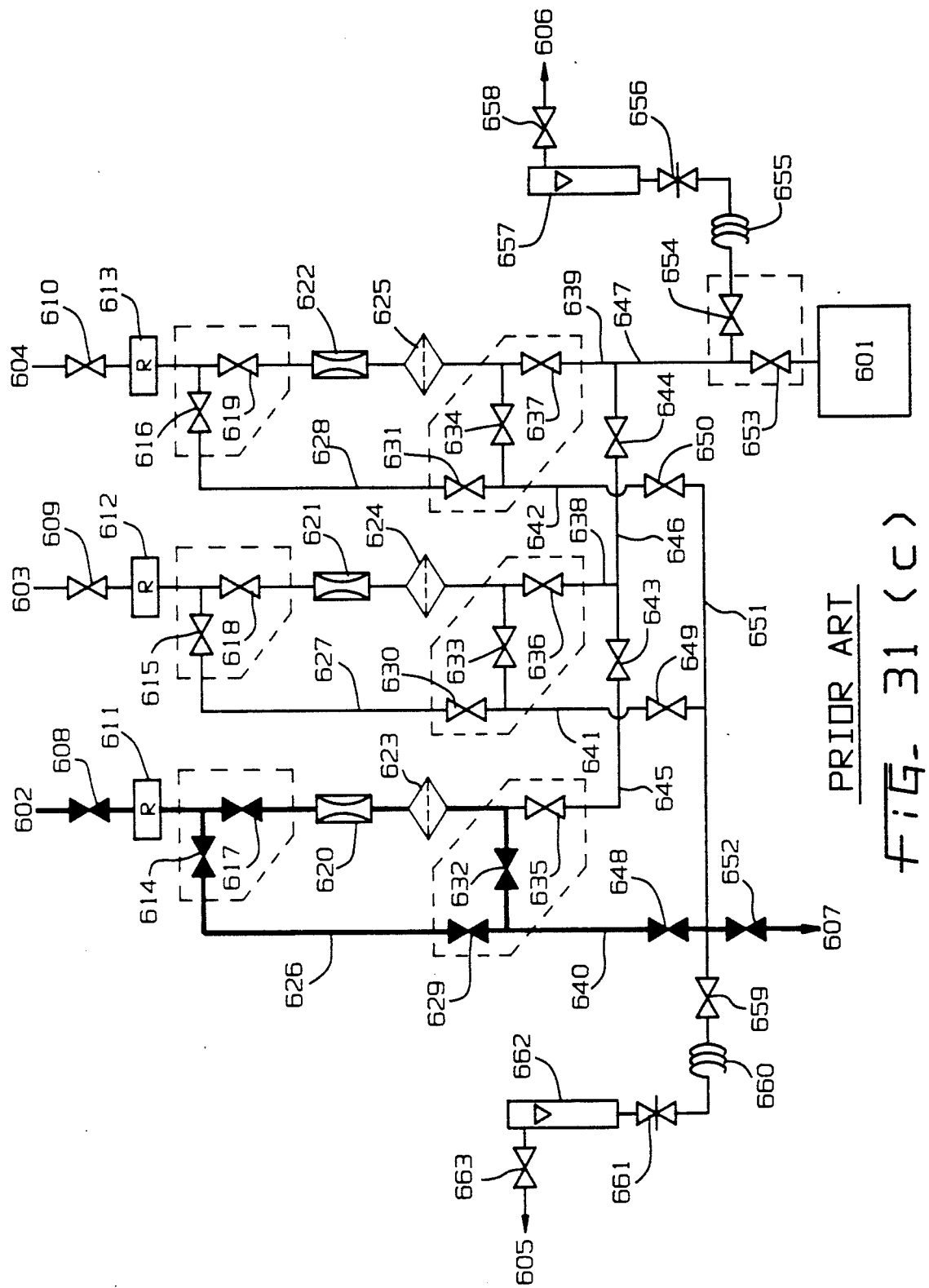
Figure 31D:
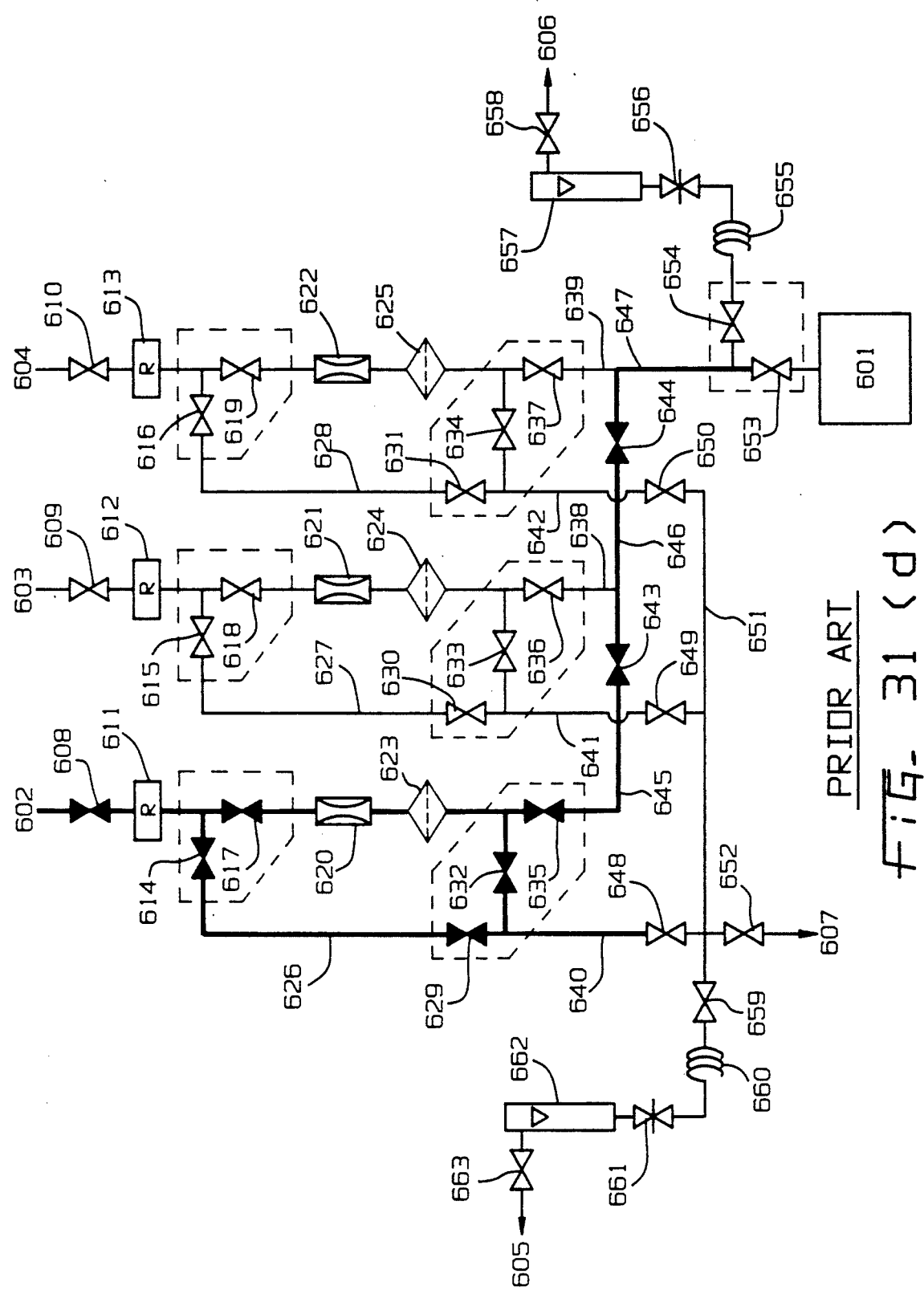
Figure 31E:
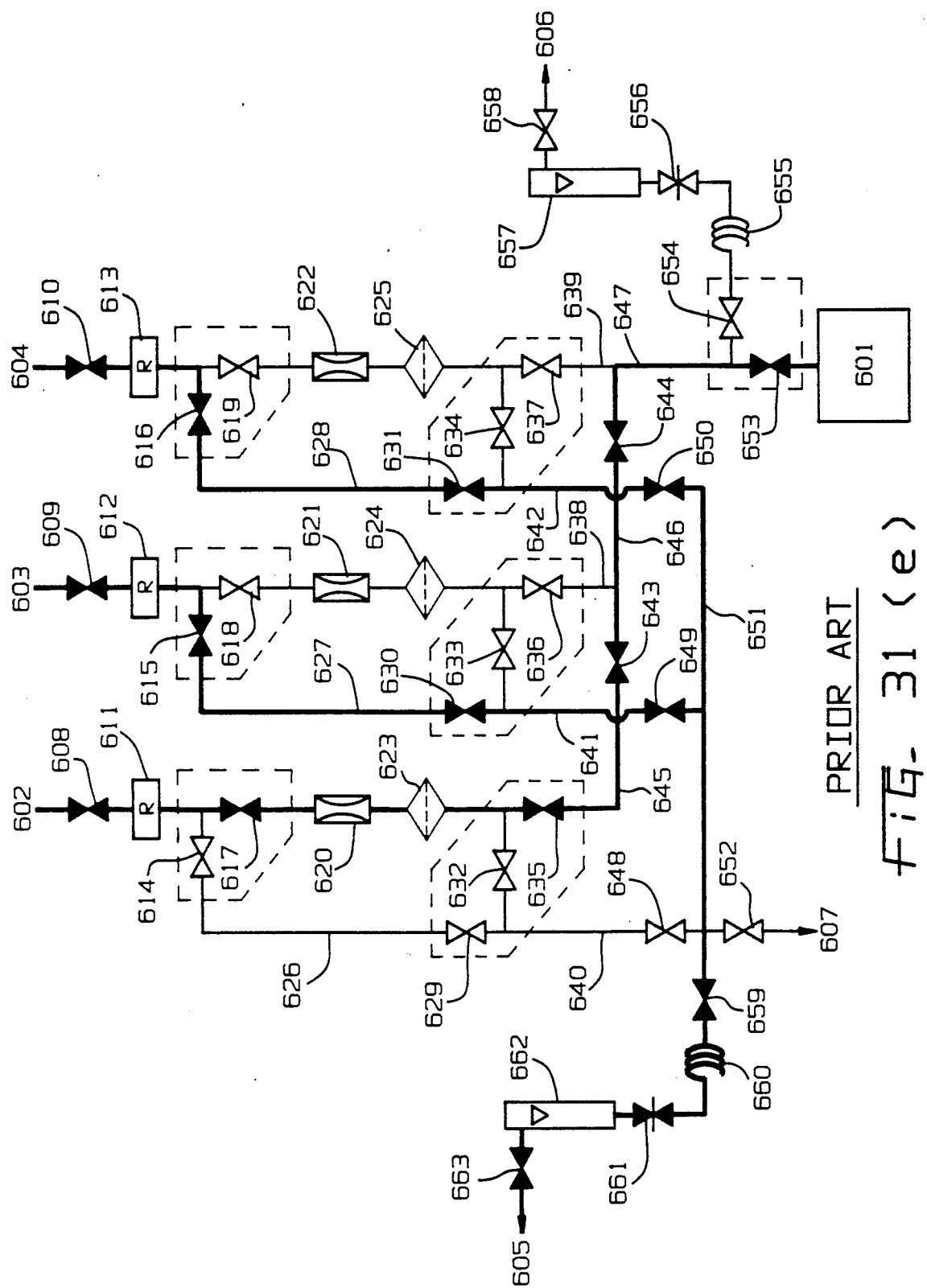
Figure 31F:
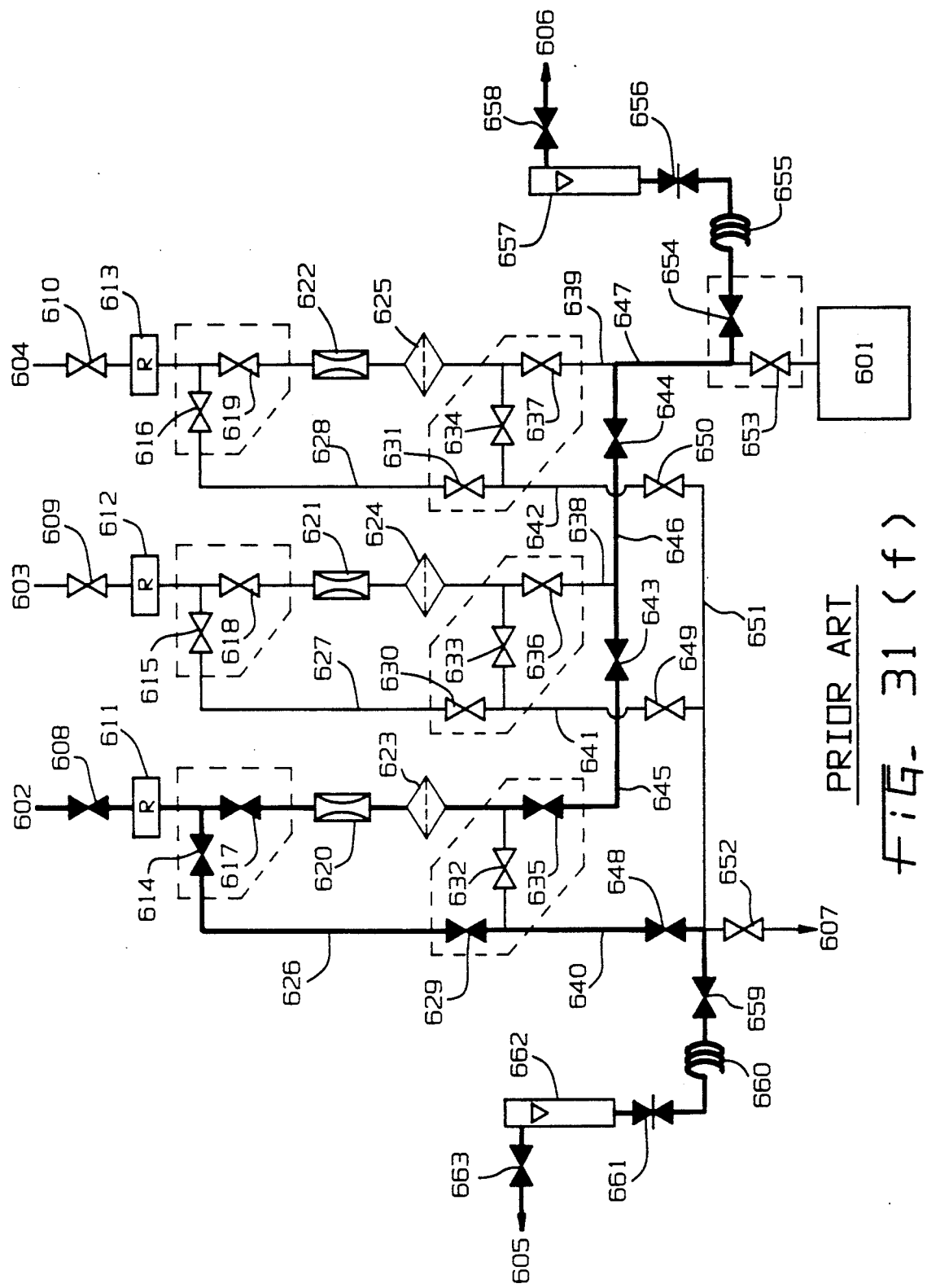
Figure 31G:
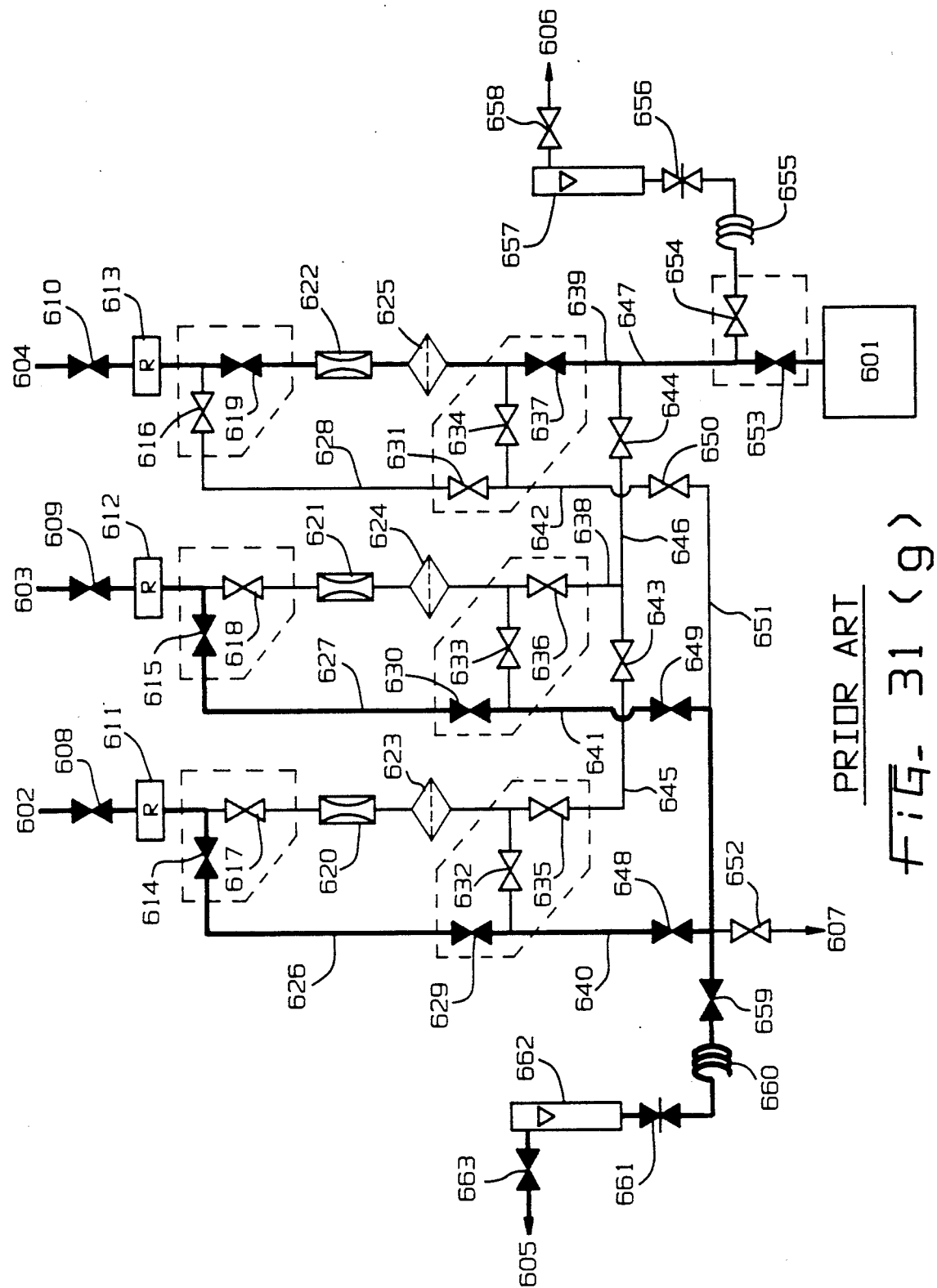
Figure 32:
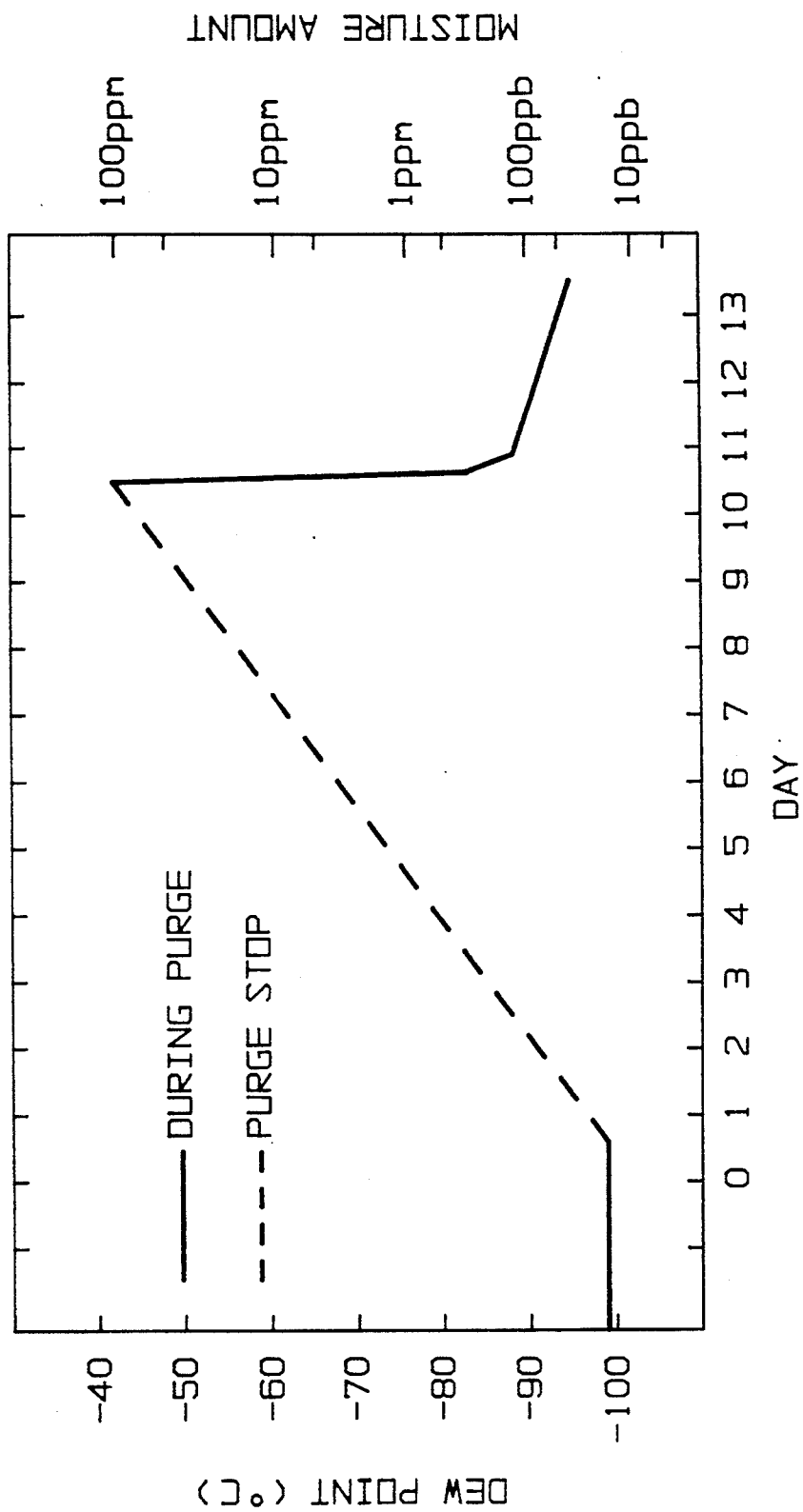
FIG. 32 is a diagram showing, in the gas supply piping device for a process apparatus, the test result of the dew point change under the condition that the piping system is closed.

The first embodiment of the above shows, for simplicity sake, the way of supplying three kinds of process gas: it is also possible to supply many kinds of process gas by using the same method. FIG. 29 and FIG. 30 respectively illustrate the second and third embodiments, which are capable of fulfilling the supply of four kinds of process gas. 401, 501 are reaction chambers of the process apparatus; 402, 403, 404, 502, 503, 504, 405, 505 are the process gas supply piping lines; 406, 407, 408, 409, 506, 507, 508, 509 are stop valves; 414, 415, 416, 514, 515, 516 are 4-valve-integrated monoblock valves; 410, 411, 412, 413, 510, 511, 512, 513 are gas regulating piping lines for regulating the supply pressure and the flow rate of the process gas. 417, 517 are 3-way dual valves. 418, 518 are purge gas exhaust pipelines, which are connected to the exhaust discharge duct. 419, 519 are pipelines for vacuum exhaust discharge and purge gas exhaust discharge. That is, the second embodiment illustrated in FIG. 29 is an example of 4-valve-integrated monoblock valves 414, 415, 416 in a pyramid structure; the third embodiment illustrated in FIG. 30 is an example shown in a ladder structure. Furthermore, the way of the supply of more than five kinds of process gas is also the same. Also, mixing together both structures is possible too.

Although the above illustrates each of the embodiment of the present invention, using, say, the system for supplying ultrapure process gas of the process gas supply system of the present invention, the external leakage must be suppressed to below $1 \times 10^{-11}$ Torr l/sec; after actual assembly of the pipelines, the external leakage of the piping system must be examined. Normally, the examination of such small leakage uses a He leak detector, and with a port for the He leak detector formed at a portion of the pipeline. In the preferred embodiment described, by forming a port for the leakage examination in the vacuum exhaust discharge and purge piping line 165, the problem of pollution of the process gas supplied to the reaction chamber of the process apparatus can be solved.

Further, as in the present invention, by utilizing monoblock valves integrated from a number of valves, it not only is effective to enhancing the performance of the gas piping system, but also achieves the outstanding effect of the miniaturization of the apparatus. Furthermore, through the use of monoblock valves, the design of the gas supply system, which requires expert knowledge in the past, has become very easy, and there are no gas dead zones; and a highly efficient gas supply piping device for a process apparatus wherein all the process gas supply systems are capable of independent purging and vacuum exhaust discharge can be designed in a simple way.

The possibility of industrial utilization

As the detailed description above, in accordance with the gas supply piping device for a process apparatus of the present invention, the following effects can be obtained.

For the apparatus as claimed in described, in the process gas supply piping system, no portion where gas cannot flow therein is formed, and it can be designed and assembled for independent purging as well as vacuum exhaust discharge of each process gas supply piping line. Therefore, the purity of gas supplied from the process gas supply piping lines for purge can be maintained at its original degree of purity; hence it can be supplied to the process apparatus as desired.

Furthermore, for the apparatus as described, by using a 4-valve-integrated monoblock valve, the dead spaces in the piping system, which cause the residence of gas, can be suppressed to be extremely few. In addition, the apparatus can be miniaturized at an extremely fast rate. Besides, the design, management, and operation of the gas supply system can also become very easy by means of this.

In this way, by means of a system which combines and cleans the process gas supply system, high quality film formations and high quality etching can become possible.

What is claimed is:

1. In a gas supply piping system, wherein a plurality of process gases are supplied to a process apparatus, said system comprising:
   - at least two gas supply pipelines, each being connected to both a process gas source and a purge gas source;
   - means for selectively introducing one of said process gas and said purge gas through each of said gas supply lines;
   - an exhaust pipeline;
   - a purge gas pipeline connected to one end of said exhaust pipeline;
   - a process apparatus pipeline communicating with a process apparatus via a connection valve; and
   - a group of valves comprising at least four valves interconnected to form a loop circuit and defining four valve interconnection points, said interconnection points respectively connected in order to a first of said gas supply pipelines, said purge gas pipeline, a second of said gas supply pipelines, and said process apparatus pipeline.

2. A gas supply piping system for supplying a plurality of process gases to a process apparatus, said system comprising;
   - at least two gas supply pipelines connected to a gas source;
   - a first exhaust pipeline;
   - a purge gas pipeline connected to one end of said first exhaust pipeline;
   - a process apparatus pipeline communicating with a process apparatus via a connection valve;
   - at least one valve block comprising at least four valves interconnected to form a loop circuit and defining four valve interconnection points, said interconnection points respectively connected in order to a first of said gas supply pipelines, said purge gas pipeline, a second of said gas supply pipelines, and said process apparatus pipeline; and
   - a second exhaust pipeline connected to said process apparatus pipeline between said interconnection points and said connection valve.

3. The gas supply piping system according to claim 2, further comprising a vacuum exhaust pipeline connected to said second exhaust pipeline, said vacuum exhaust pipeline being connected to a vacuum source.

4. The gas supply piping system according to claim 2, wherein said interconnection points of an ith valve block, wherein i is an integer equal to or greater than 2, are respectively connected in order to said process apparatus pipeline leading from an (i−1)th valve block, said purge gas pipeline, said gas supply pipeline, and said process apparatus pipeline leading to one of an (i+1)th valve block and said process apparatus.

5. The gas supply piping system according to claim 2, wherein said interconnection points of an ith valve block, wherein i is an integer equal to or greater than 2, are respectively connected in order to said process apparatus pipeline leading from an (i−1)th valve block, said purge pipeline, said process apparatus pipeline leading from an (i+1)th valve block, said process apparatus pipeline leading to one of an (i+2)th valve block and said process apparatus.

* * * * *